(12) United States Patent
Matsuoka

(10) Patent No.: US 11,088,671 B2
(45) Date of Patent: Aug. 10, 2021

(54) SURFACE ACOUSTIC WAVE DEVICE, FILTER CIRCUIT, AND ELECTRONIC COMPONENT

(71) Applicant: NDK SAW Devices Co., Ltd., Hokkaido (JP)

(72) Inventor: Naoto Matsuoka, Saitama (JP)

(73) Assignee: NDK SAW Devices Co., Ltd., Hokkaido (JP)

( * ) Notice: Subject to any disclaimer, the term of this patent is extended or adjusted under 35 U.S.C. 154(b) by 0 days.

(21) Appl. No.: 16/868,526

(22) Filed: May 6, 2020

(65) Prior Publication Data
US 2020/0366270 A1 Nov. 19, 2020

(30) Foreign Application Priority Data
May 16, 2019 (JP) .............................. JP2019-092973

(51) Int. Cl.
| | |
|---|---|
| *H03H 9/02* | (2006.01) |
| *H03H 9/25* | (2006.01) |
| *H03H 9/64* | (2006.01) |
| *H03H 9/13* | (2006.01) |

(52) U.S. Cl.
CPC .... *H03H 9/02866* (2013.01); *H03H 9/02275* (2013.01); *H03H 9/02559* (2013.01); *H03H 9/02582* (2013.01); *H03H 9/02992* (2013.01); *H03H 9/13* (2013.01); *H03H 9/25* (2013.01); *H03H 9/6406* (2013.01)

(58) Field of Classification Search
CPC .. H03H 9/25; H03H 9/02992; H03H 9/02275; H03H 9/02866; H03H 9/02582; H03H 9/02559; H03H 9/6406; H03H 9/13; H03H 9/02574; H03H 9/14538; H03H 3/08; H03H 9/145; H03H 9/64
USPC ......................................... 333/133, 193–196
See application file for complete search history.

(56) References Cited

U.S. PATENT DOCUMENTS

2017/0272049 A1* 9/2017 Kawachi ............ H03H 9/02535

FOREIGN PATENT DOCUMENTS

| | | |
|---|---|---|
| JP | 3952666 | 8/2007 |
| JP | 5713025 | 5/2015 |

* cited by examiner

*Primary Examiner* — Robert J Pascal
*Assistant Examiner* — Jorge L Salazar, Jr.
(74) *Attorney, Agent, or Firm* — JCIPRNET

(57) ABSTRACT

A surface acoustic wave device includes a piezoelectric material layer, a pair of busbars, a plurality of electrode fingers, and reflectors. The piezoelectric material layer has a thickness that is in a range of 1 to 2.5 times of an acoustic wavelength. A main mode of an elastic wave excited on the piezoelectric material layer by the electrode fingers is a leaky surface acoustic wave. A design variable is set such that a minimum propagation loss frequency where a propagation loss becomes minimum and a frequency of a plate wave spurious formed due to a slow shear wave excited together with the leaky surface acoustic wave are matched. A propagation velocity of a slowest bulk wave of an elastic wave that propagates in a lower layer of the piezoelectric material layer is equal to or more than 1.05 times of a velocity of the leaky surface acoustic wave.

18 Claims, 19 Drawing Sheets

SURFACE ACOUSTIC WAVE DEVICE, FILTER CIRCUIT, AND ELECTRONIC COMPONENT

CROSS-REFERENCE TO RELATED APPLICATIONS

This application is based on and claims priority under 35 U.S.C. § 119 to Japanese Patent Application No. 2019-092973, filed on May 16, 2019, the entire content of which is incorporated herein by reference.

TECHNICAL FIELD

This disclosure relates to a surface acoustic wave device that converts a frequency signal into a surface acoustic wave.

DESCRIPTION OF THE RELATED ART

A surface acoustic wave (SAW) device that uses a surface acoustic wave (SAW) is mainly used as a mobile communication terminal filter and a duplexer (antenna sharing device). As a piezoelectric substrate used for the SAW device, a single crystal piezoelectric material, such as $LiTaO_3$ and $LiNbO_3$, is widely used.

Meanwhile, in association with development of a communication system that uses a frequency band having a very narrow transmission and reception frequency interval typified by BAND25, and development of a communication system that simultaneously communicates using a plurality of frequency bands, such as a carrier aggregation, market demands for a device that has a low insertion loss and a very steep transition band between a pass band and a stop band are recently increasing.

There is a case, such as Japanese Patent No. 3952666, in which a linear expansion coefficient of a piezoelectric substrate is improved by bonding the $LiTaO_3$ to a supporting substrate to narrow the transition band between the pass band and the stop band. However, a technique described in Japanese Patent No. 3952666 only improves a frequency/temperature characteristic by reduction in the linear expansion coefficient and cannot sufficiently reduce the insertion loss.

Recently, as a method of further reducing the loss and improving the temperature characteristic, a technique as described in Japanese Patent No. 5713025 is proposed. The technique is to bond the piezoelectric substrate and the supporting substrate and to make a thickness of the piezoelectric substrate considerably thin to be equal to or less than one time of an acoustic wavelength of the SAW (described as "equal to or less than one acoustic wavelength" and the like). With this technique, confining a leaky component of a leakage surface acoustic wave within the piezoelectric substrate ensures a significant improvement in properties. However, configuring the piezoelectric substrate to be equal to or less than one acoustic wavelength causes a problem that the thickness of the piezoelectric substrate becomes approximately 1 μm or less, leading to a difficulty in manufacturing. Configuring the piezoelectric substrate to be equal to or less than one acoustic wavelength also causes a problem that variation in the thickness of the piezoelectric substrate causes a large variation in the frequency characteristic of the SAW device.

A need thus exists for a surface acoustic wave which is not susceptible to the drawback mentioned above.

SUMMARY

According to an aspect of this disclosure, there is provided a surface acoustic wave device that includes a piezoelectric material layer, a pair of busbars, a plurality of electrode fingers, and reflectors. The piezoelectric material layer is disposed on a supporting substrate. The pair of busbars are formed on an upper surface of the piezoelectric material layer. The plurality of electrode fingers mutually extend in a comb shape from the respective busbars toward the opposed busbars. The reflectors are arranged on both sides of formation regions of the plurality of electrode fingers. The piezoelectric material layer has a thickness that is in a range of 1 to 2.5 times of an acoustic wavelength specified based on an arrangement interval of the plurality of electrode fingers. A main mode of an elastic wave excited on the piezoelectric material layer by the electrode fingers is a leaky surface acoustic wave. A design variable is set such that in the leaky surface acoustic wave, a minimum propagation loss frequency where a propagation loss becomes minimum and a frequency of a plate wave spurious formed due to a slow shear wave excited together with the leaky surface acoustic wave are matched. A propagation velocity of a slowest bulk wave of an elastic wave that propagates in a lower layer of the piezoelectric material layer is equal to or more than 1.05 times of a velocity of the leaky surface acoustic wave.

BRIEF DESCRIPTION OF THE DRAWINGS

The foregoing and additional features and characteristics of this disclosure will become more apparent from the following detailed description considered with reference to the accompanying drawings.

DETAILED DESCRIPTION

Figure 1:
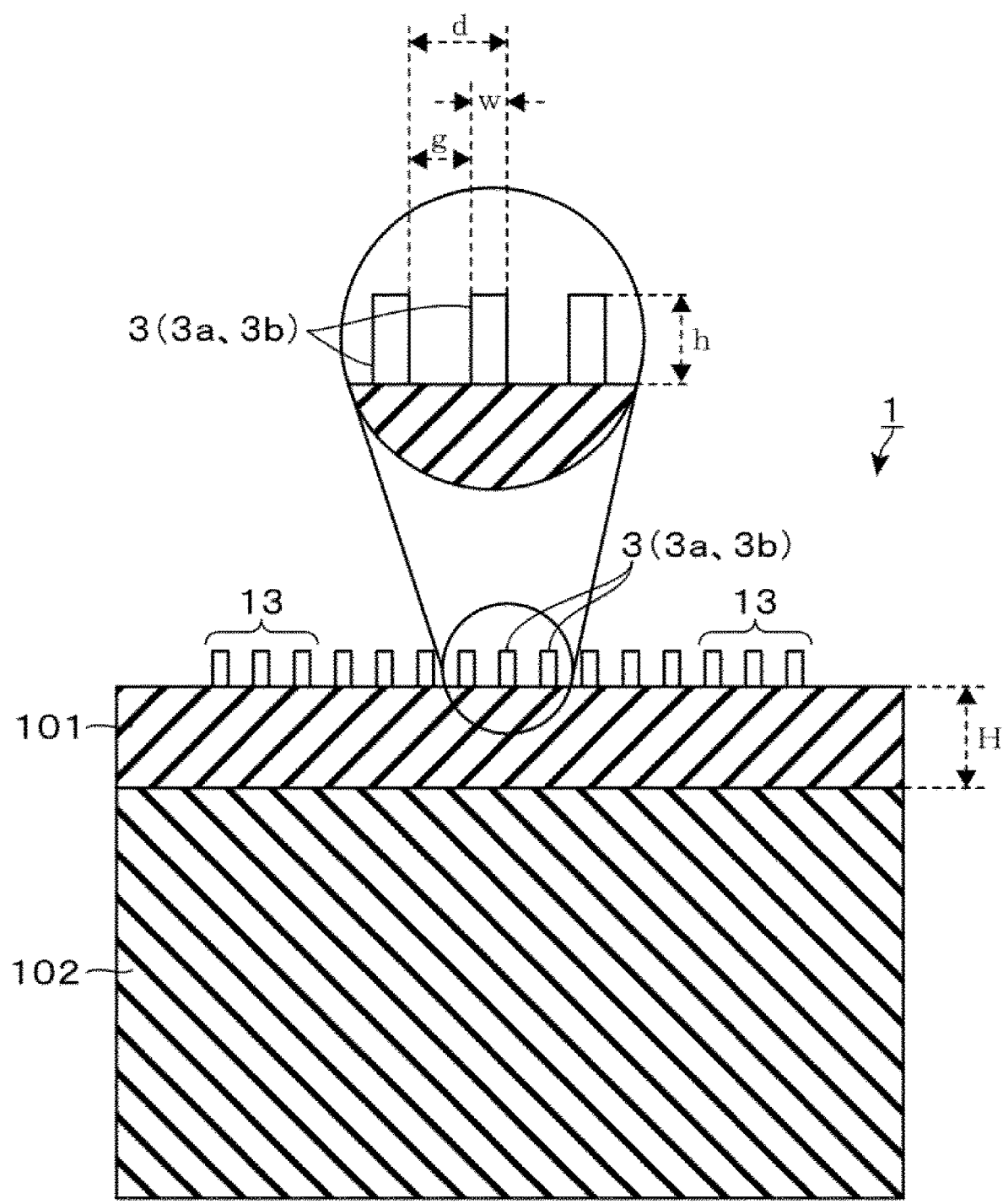
FIG. 1 is a longitudinal sectional side view of a SAW device according to an embodiment.

First, a description will be given of an exemplary configuration a surface acoustic wave device (SAW device) 1 according to an embodiment by referring to FIG. 1 and FIG. 2. FIG. 1 is a longitudinal sectional side view schematically illustrating the SAW device 1 of this example, and FIG. 2 is an enlarged plan view schematically illustrating the SAW device 1.

Figure 2:
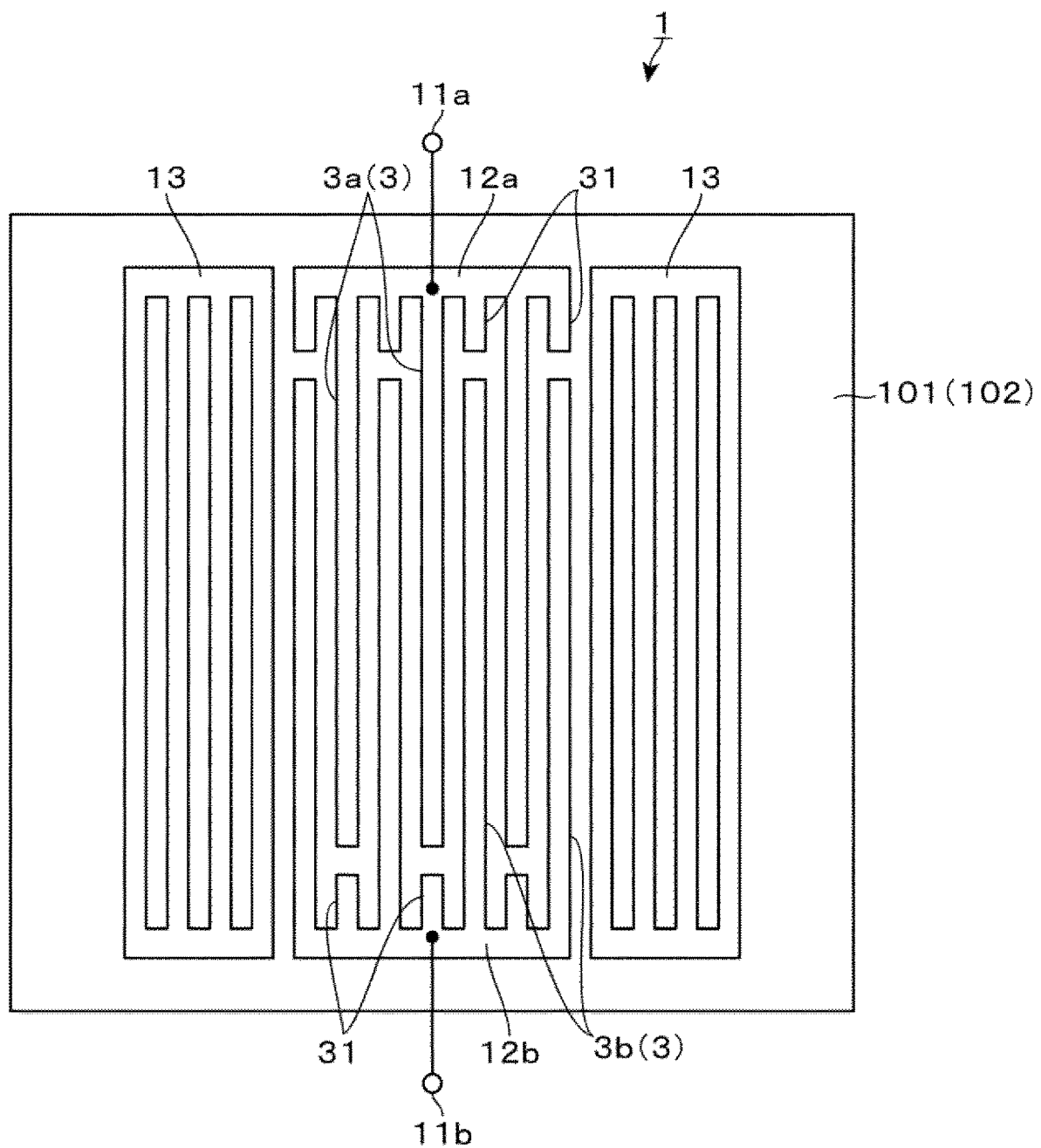
FIG. 2 is a plan view of the SAW device.

As illustrated in FIG. 1 and FIG. 2, for example, the SAW device 1 has a configuration in which a piezoelectric layer 101 that excites a SAW is bonded on a rectangular-shaped supporting substrate 102 and an interdigital transducer (IDT) electrode and reflectors 13 are disposed on an upper surface of the piezoelectric layer 101.

The IDT electrode is disposed, for example, to extend along two opposed sides of the piezoelectric layer 101. The IDT electrode includes two busbars 12a and 12b connected to respective signal ports 11a and 11b, and a large number of electrode fingers 3a and 3b formed to extend from the respective busbars 12a and 12b toward a direction intersecting with these busbars 12a and 12b.

As illustrated in FIG. 2, the electrode fingers 3a connected to one busbar 12a are disposed to extend toward a side of the busbar 12b arranged at an opposed position. The electrode fingers 3b connected to the other busbar 12b are disposed to extend toward the one busbar 12a. When viewed along an arranged direction of the electrode fingers 3a and 3b, the electrode fingers 3a connected to the one busbar 12a and the electrode fingers 3b connected to the other busbar 12b are alternately arranged. Additionally, as illustrated in FIG. 2, dummy electrodes 31 may be connected to the respective busbars 12a and 12b.

The reflectors 13 are configured by a plurality of short-circuited electrode fingers and arranged both sides of the above-described IDT electrode.

As a material that constitutes the piezoelectric layer 101, about 42°-rotated Y-cut X-propagation ((0°, 132°, 0°) in an Euler angle notation) LiTaO$_3$ (hereinafter also referred to as "42LT") can be exemplified. The busbars 12a and 12b and the electrode fingers 3a and 3b are configured of, for example, aluminum (Al).

As illustrated in FIG. 1, a thickness h of the electrode fingers 3 (3a and 3b), an arrangement interval d of adjacent electrode fingers 3, an electrode finger width w of the electrode fingers 3, a gap width g of the electrode fingers 3, and a thickness H of the piezoelectric layer 101 are defined.

In the SAW device 1 having the above-described configuration, a leaky surface acoustic wave (leaky SAW) of a main mode is excited, and an elastic wave component referred to as a "slow shear wave" is leaked toward an inside of the piezoelectric layer 101, thus causing an acoustic loss. In view of this, usually, in a SAW device using the leaky surface acoustic wave, a Q-value is limited.

In contrast to this, the SAW device 1 in this example has a configuration in which the piezoelectric layer 101 is bonded on the supporting substrate 102 including a material that has a propagation velocity of the slow shear wave higher than a velocity of the SAW in the piezoelectric layer 101. This configuration allows the elastic wave component that is leaked toward the inside of the piezoelectric layer 101 to be confined in the piezoelectric layer 101 and allows the Q-value to improve.

That is, since the propagation velocity is high in the piezoelectric layer 101, the elastic wave leaked from a surface of the piezoelectric layer 101 (slow shear wave) is reflected by a boundary surface between the supporting substrate 102 and the piezoelectric layer 101. Then, the reflected elastic wave propagates to a surface side of the supporting substrate 102 and received again by the IDT electrode, thus being detected as an electric signal. This improves the loss caused by the leakage of the elastic wave toward the inside of the substrate and can improve device performance (Q-value).

Meanwhile, when the sheet-shaped piezoelectric layer 101 is bonded on the supporting substrate 102 having a high propagation velocity of the elastic wave, a plate wave type spurious mode is generated by the elastic wave component leaked toward the inside of the piezoelectric layer 101. For example, in Japanese Patent No. 5713025 described above, the thickness of the piezoelectric layer 101 is configured to be extremely thin, so as to be less than one acoustic wavelength (λ). This allows for designing such that a frequency at which the plate wave type spurious mode is generated outside a pass band of a filter including the SAW device 1.

However, in Japanese Patent No. 5713025 for example, a description describing that a thickness of a piezoelectric layer is preferably equal to or less than around 0.5λ can be found. At this time, in the case of the SAW device 1 having 1 to 2 GHz, the thickness H of the piezoelectric layer 101 is equal to or less than around 2 μm to 1 μm, and the piezoelectric layer 101 that is considerably thin should be manufactured. Usually, the piezoelectric layer 101 is clipped from crystal, bonded on the supporting substrate 102 by direct bonding and the like, and processed to a desirable thickness by lapping and the like. In view of this, not only is it difficult to manufacture an extremely thin piezoelectric layer 101, but also it is possible that a large variation is caused in a frequency characteristic of the SAW device 1 due to variation in the thickness of the piezoelectric layer 101.

On the other hand, when the piezoelectric layer 101 that has a thickness equal to or more than one acoustic wavelength is used, the problem in manufacturing is suppressed, but the problem of the spurious by the plate wave is raised as described above.

Figure 3:
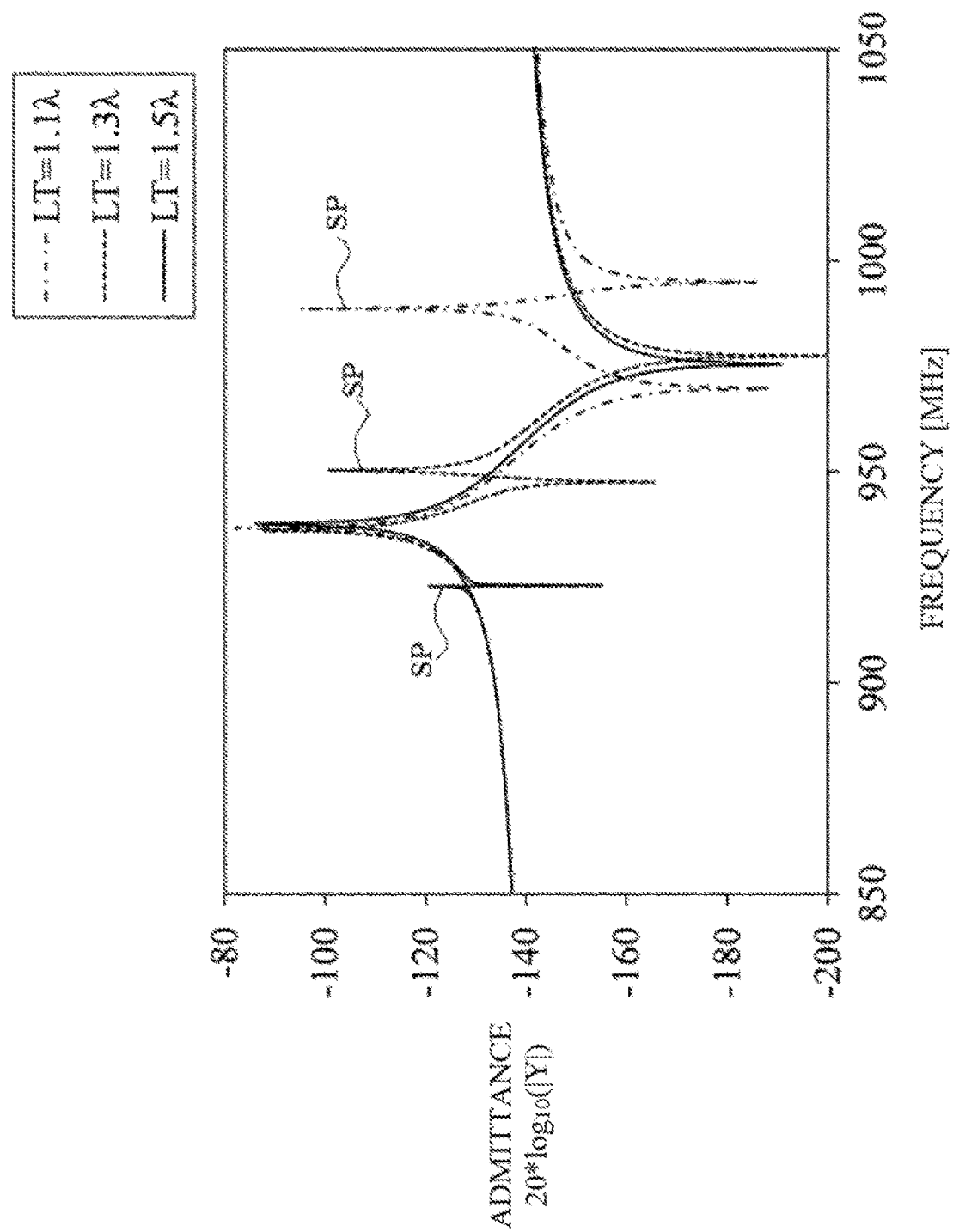
FIG. 3 is a characteristic diagram illustrating change in a position at which a spurious occurs corresponding to thicknesses of a piezoelectric material layer.

For example, FIG. 3 indicates a simulation result of frequency characteristics in an infinite periodic grating when the thickness H of the piezoelectric layer 101 is changed to each of 4.4 (1.1λ (acoustic wavelength)), 5.2 (1.3λ), and 6 μm (1.5λ) assuming that an aluminum (Al) IDT electrode (2 μm as the arrangement interval d of the electrode fingers 3, 1 μm as the electrode finger width w, and 480 nm as the electrode thickness h) is on the 42LT piezoelectric layer 101.

According to FIG. 3, it can be seen that a spurious response (SP) is generated near a resonance frequency and an anti-resonance frequency of the SAW device 1 in the piezoelectric layer 101 that has a thickness equal to or more than one acoustic wavelength. Additionally, it can be confirmed that as the piezoelectric layer 101 thickens, this spurious has a reduced frequency and its strength tends to decrease.

In this embodiment, suppressing the spurious caused when the thickness H of the piezoelectric layer 101 is configured to be equal to or more than one acoustic wavelength ensures reducing the difficulty in manufacturing and obtaining the high-performance SAW device 1.

In order to solve these technical problems, the inventor focused on a minimum propagation loss frequency $f_d$ in which the loss of the leaky surface acoustic wave becomes minimum and found that the minimum propagation loss frequency $f_d$ can be adjusted by the thickness h of the electrode fingers 3 and a cut angle of the piezoelectric layer 101.

For example, as described in a reference document (O. Kawachi, et al., IEEE Transaction of Ultrasonics, Ferroelectric and Frequency Control Vol. 48. No. 5 (2001) 10.1109/58.949755), it is known that in the minimum propagation loss frequency $f_d$, the "slow shear wave" described above is separated from the leaky surface acoustic wave. This indicates that in the minimum propagation loss frequency $f_d$, a leaky component in association with an excitation of the SAW becomes considerably small.

Therefore, when the leaky component that induces the plate wave causing the spurious is suppressed to be small by matching the frequency of the spurious generated when the piezoelectric layer 101 has the thickness equal to or more than one acoustic wavelength with the minimum propagation loss frequency $f_d$, the spurious can be suppressed. This suppresses the generation of the spurious in the pass band, while reducing the loss by confining the leaky surface acoustic wave within the piezoelectric layer 101.

Figure 4:
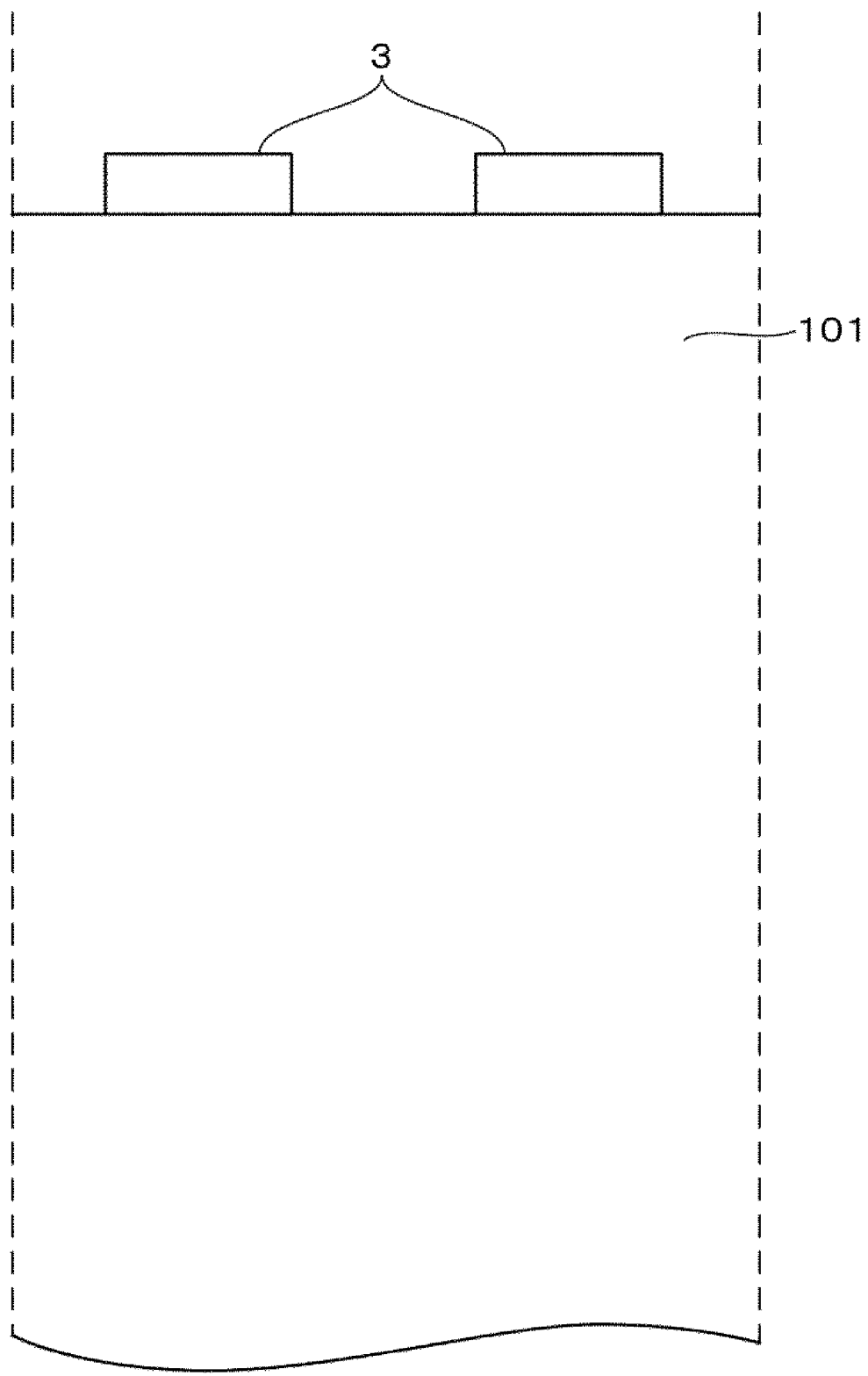
FIG. 4 is a simulation model diagram for obtaining a minimum propagation loss frequency.

Next, a method of identifying a resonance frequency $f_r$, the minimum propagation loss frequency $f_d$, or a frequency of each mode will be described. FIG. 4 is a model of an infinite periodic grating structure on which a boundary condition is imposed. The boundary condition is such that the electrode fingers 3 are disposed on the piezoelectric layer 101 and its right and left end portions are continuous. Analyzing this model using a finite element method (FEM) ensures identifying the respective above-described frequencies.

Figure 5:
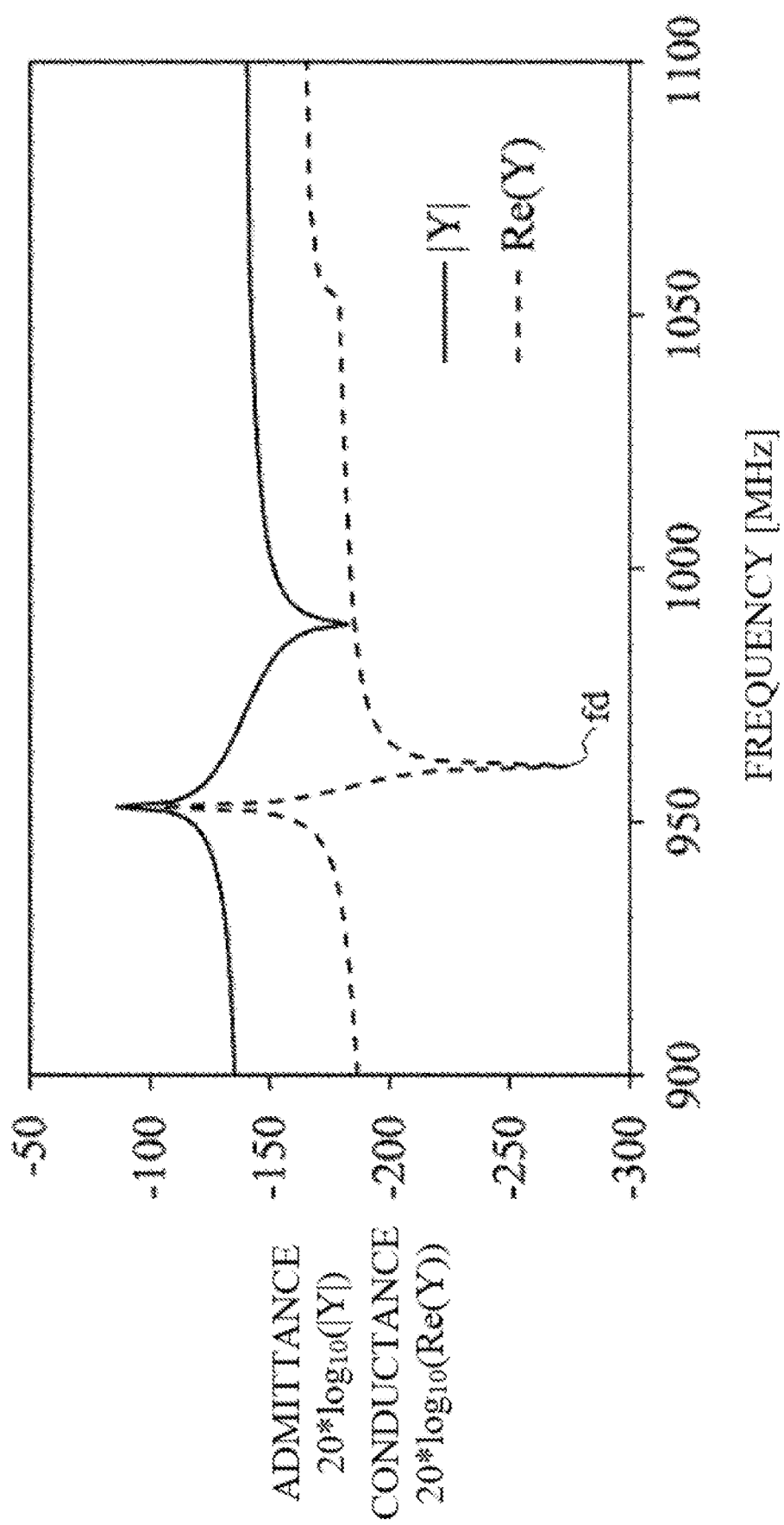
FIG. 5 is a characteristic diagram illustrating the minimum propagation loss frequency.

FIG. 5 indicates a result of calculation when for example in FIG. 4, 48 LT is used as the piezoelectric material, the thickness h of the aluminum electrode fingers 3 is 11% of the acoustic wavelength λ, the arrangement interval d is 2 μm, the finger width w is 1 μm, and the acoustic wavelength λ is 4 μm. According to FIG. 5, a maximum peak of a conductance (real part of an admittance) can be identified as the resonance frequency $f_r$, and a minimum peak of the conductance can be identified as the minimum propagation loss frequency $f_d$.

Figure 8:
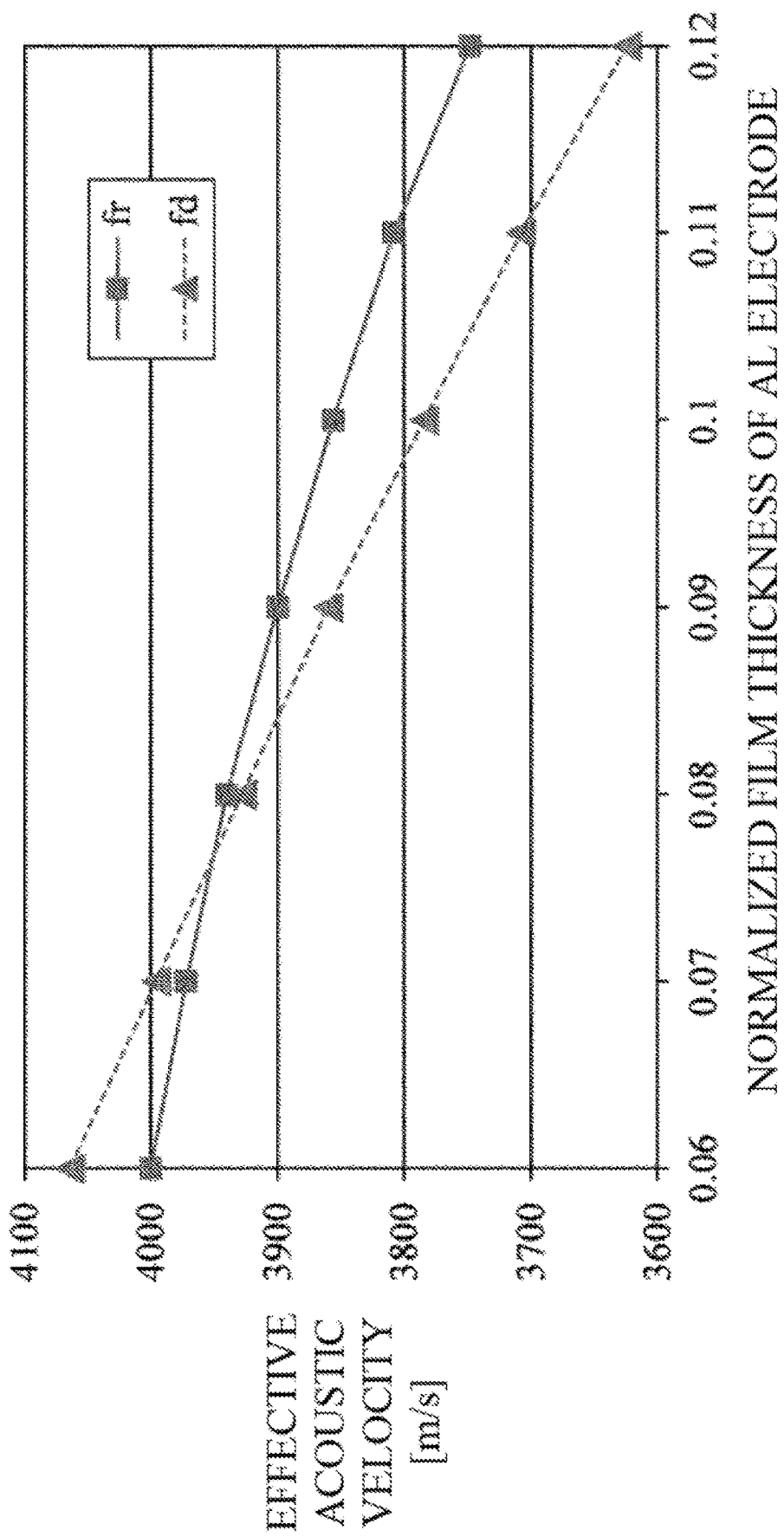
FIG. 8 is a first characteristic diagram illustrating a relation between the thickness of the electrode finger and an effective acoustic velocity in a resonance frequency and the minimum propagation loss frequency.
Figure 14:
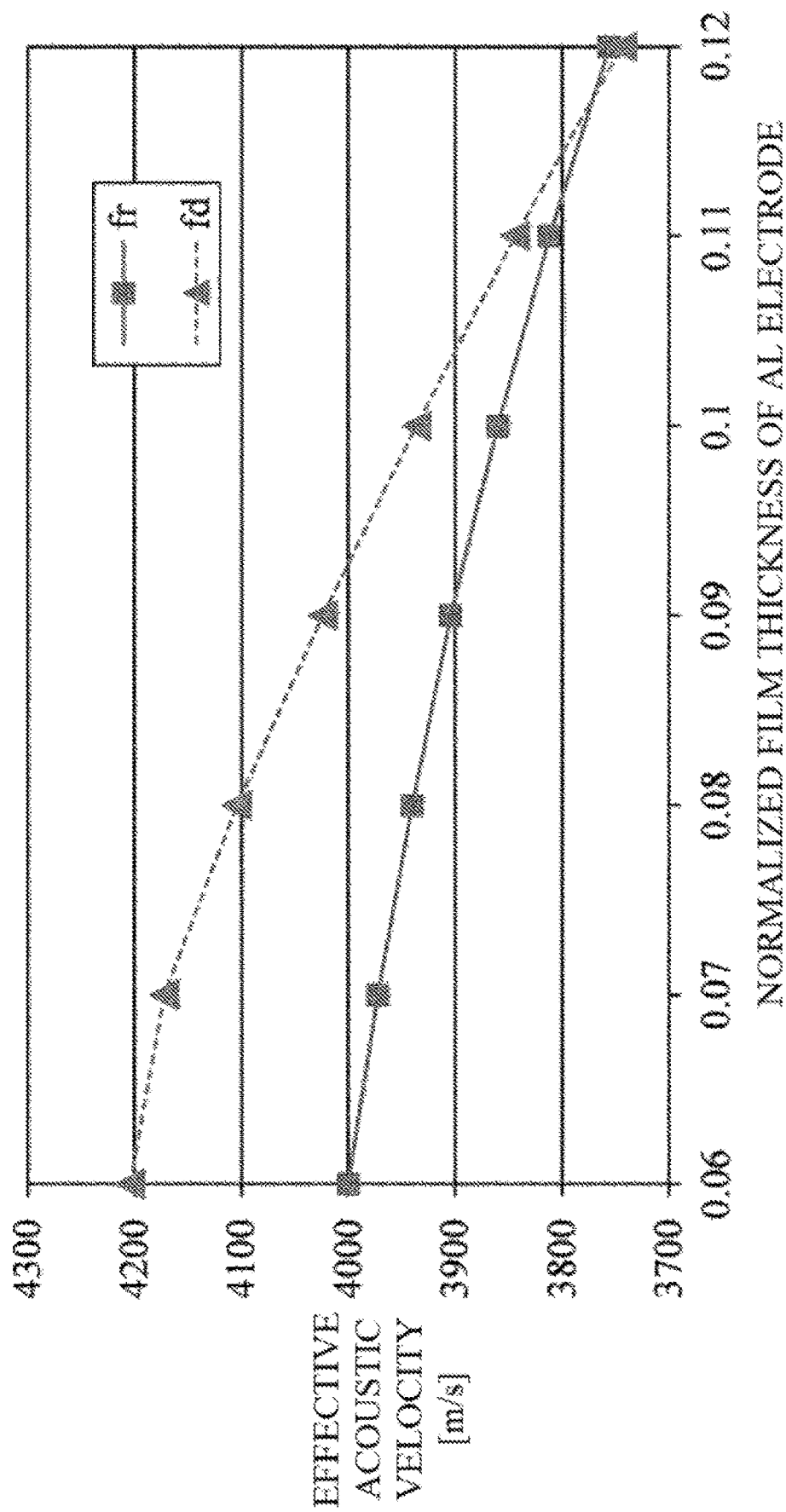
FIG. 14 is a second characteristic diagram illustrating a relation between the thickness of the electrode finger and the effective acoustic velocity in the resonance frequency and the minimum propagation loss frequency.

Then, by plotting values obtained by changing parameters, such as the piezoelectric material that constitutes the piezoelectric layer 101 and its cut angle, and the electrode material that constitutes the electrode fingers 3 and its thickness h, graphs indicating states of change of the resonance frequency $f_r$ and the minimum propagation loss frequency $f_d$ can be obtained (FIG. 8 and FIG. 14 described below).

Figure 7:
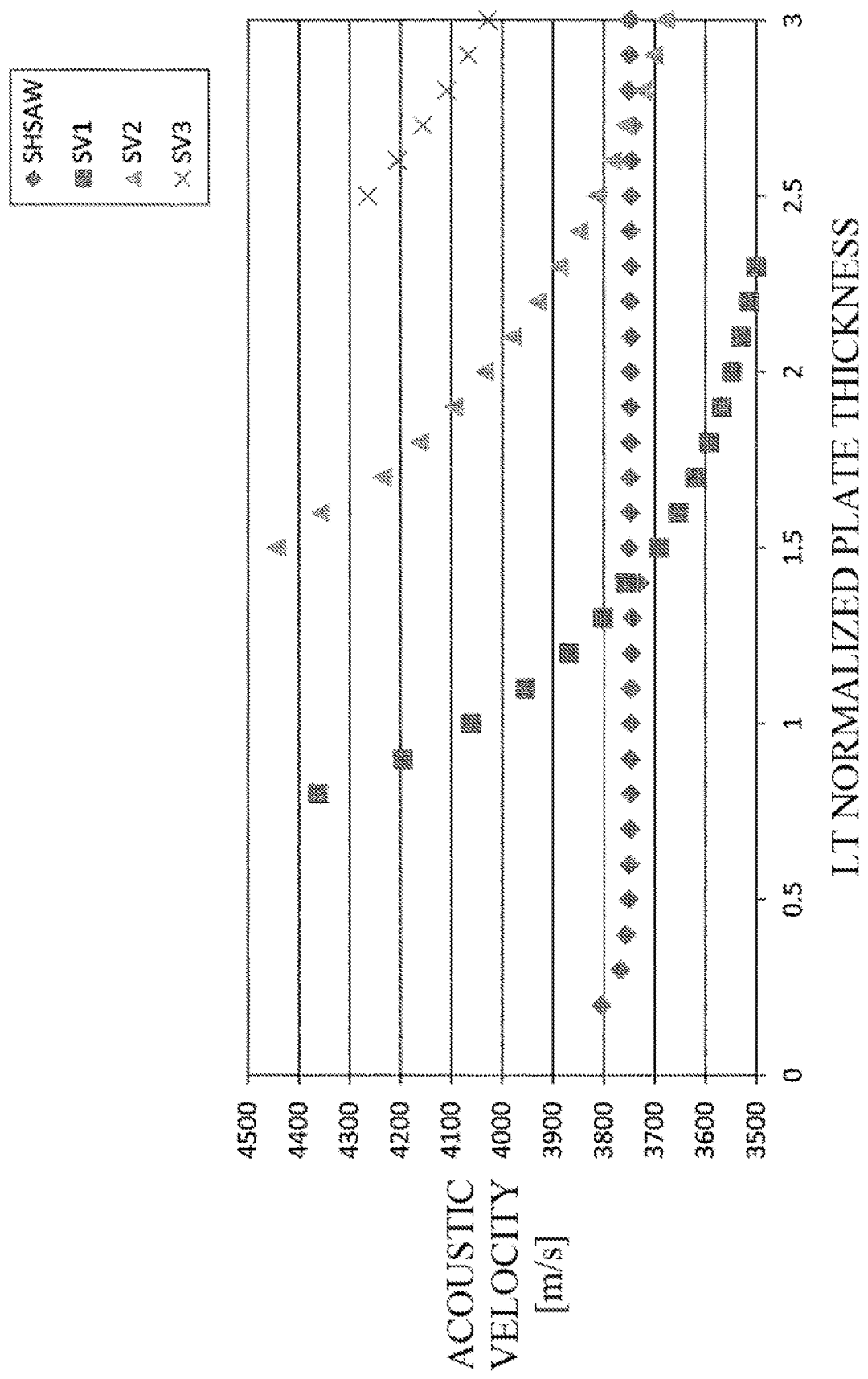
FIG. 7 is a first characteristic diagram illustrating a relation between a thickness of the piezoelectric material layer and a propagation velocity of an elastic wave.
Figure 13:
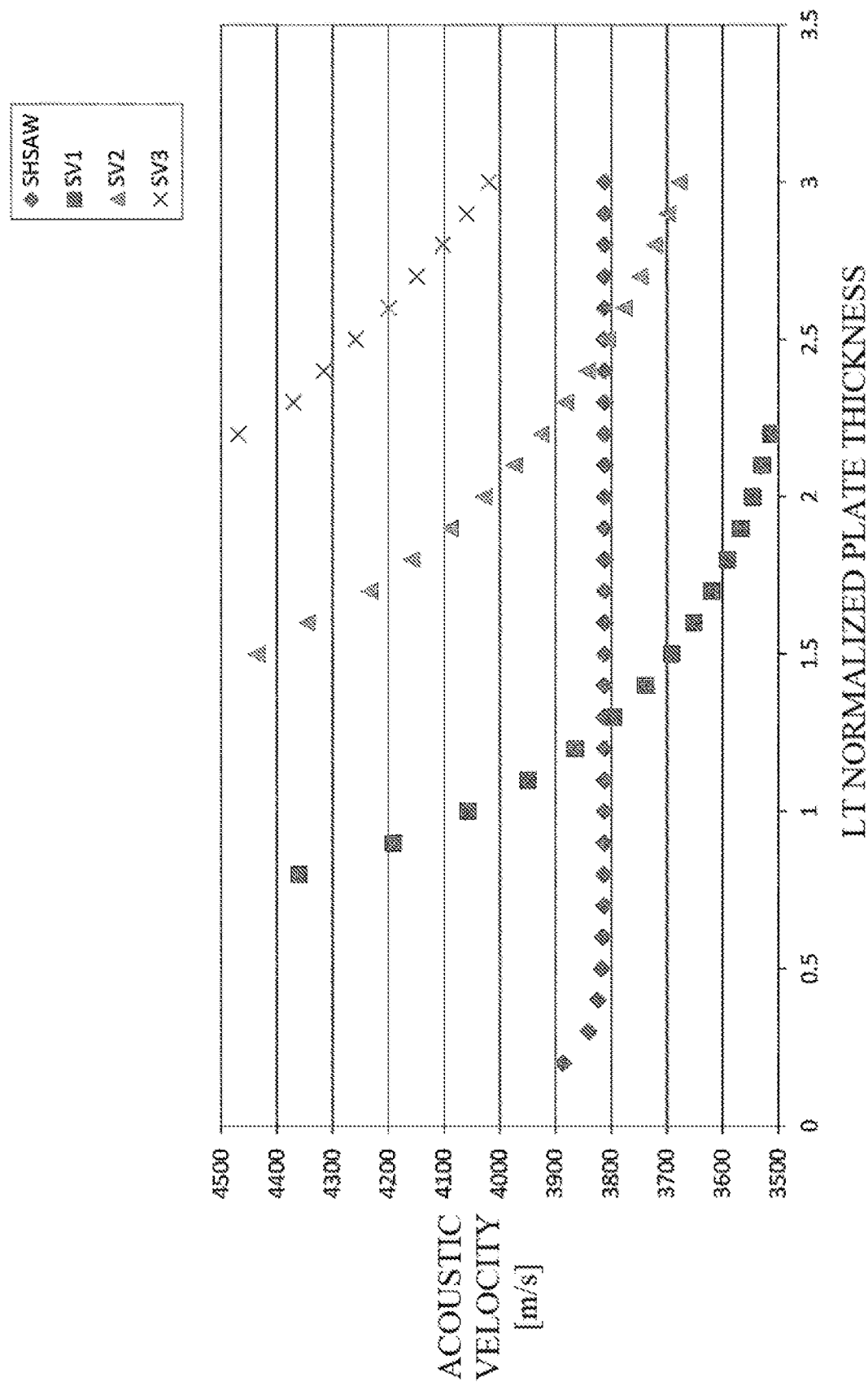
FIG. 13 is a second characteristic diagram illustrating a relation between the thickness of the piezoelectric material layer and the propagation velocity of the elastic wave.

On the other hand, when the plate wave is calculated, in FIG. 4, the model is changed to have the supporting substrate 102 at a lower portion of the piezoelectric material to conduct a similar analysis. With the thickness H, the constituent material, and the cut angle of the piezoelectric layer 101, and the thickness h and the constituent material of the electrode fingers 3, and the like as the parameters, resonance frequencies of the main mode and the respective plate waves are calculated. This can obtain mode charts of the SAW and the slow transverse wave (FIG. 7 and FIG. 13 described below).

Unless otherwise stated, the following analysis is conducted on a case that is set as follows. The constituent material of the supporting substrate 102 (supporting substrate material) is 42LT. The electrode material of the electrode fingers 3 is aluminum. The arrangement interval d of the electrode fingers 3 is 2 μm. The electrode finger width w of the electrode fingers 3 is 1 μm (electrode occupancy 0.5). The acoustic wavelength λ of the SAW is 4 μm. The number of the electrode fingers 3 is 257. The number of reflectors 13 are 32 each on both sides. The electrode fingers 3 and the reflectors 13 have a same interval. An intersection width of the electrode fingers 3 (3a and 3b) is 20λ.

Figure 6:
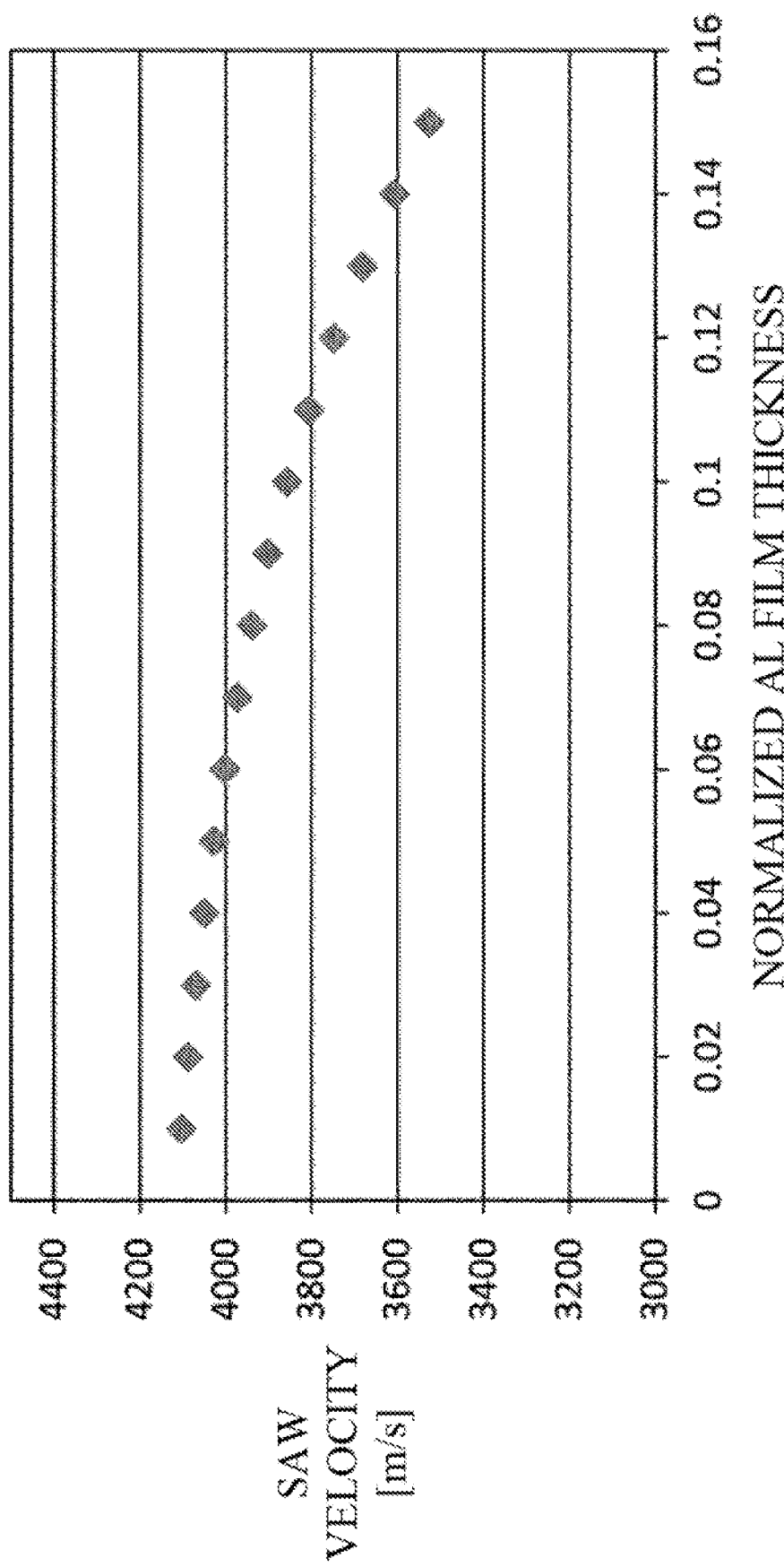
FIG. 6 is a characteristic diagram illustrating a relation between a thickness of an electrode finger and a propagation velocity of a SAW.

FIG. 6 indicates a dependence of a SAW velocity on the thickness of the electrode fingers 3 normalized by a wavelength of the SAW in a case where the electrode occupancy (the electrode finger width w of the electrode fingers 3/the arrangement interval d of the electrode fingers 3) is 0.5. From this result, when the thickness of the electrode fingers 3 is equal to or more than around 9% of the acoustic wavelength (λ), the SAW velocity becomes equal to or less than 0.93 times (about 3915 m/s) of an acoustic velocity 4210 m/s of a "fast shear wave," which is one of bulk waves of the 42LT that constitutes the supporting substrate 102. Consequently, since a plate wave spurious caused by the fast shear wave falls outside the pass band, it can be seen that this case is preferable.

However, in a case where the electrode occupancy of the electrode fingers 3 is larger than 0.5, in a case where the electrode material is a material having a density higher than Al, such as Cu, Au, Pt, Ti, Ru, W, Mo, and Co, or in a case where a high-density electrode material and Al are compounded and laminated to constitute the electrode fingers 3 and the like, the SAW velocity possibly becomes sufficiently slow even when the thickness h of the electrode fingers 3 is less than 9% of the acoustic wavelength λ. Therefore, the thickness h of the electrode fingers 3 is not limited to the case of being set to be equal to or more than 9% of the acoustic wavelength λ.

FIG. 7 is a mode chart in which acoustic velocities of the main mode and the plate wave spurious modes relative to the thickness of the piezoelectric layer 101 normalized by the wavelength λ of the SAW are plotted. In addition to the analysis conditions described above, the analysis is conducted with the thickness h of the electrode fingers 3 as 480 nm (12% of the acoustic wavelength λ). In FIG. 7, "SHSAW" indicates the main mode, and "SV1, SV2, and SV3" indicate the plate wave spurious modes due to slow shear waves that have respective different orders.

Additionally, FIG. 8 is a plot of effective acoustic velocities of the minimum propagation loss frequency $f_d$ and the resonance frequency $f_r$ relative to respective film thicknesses of the electrode fingers 3 formed on the piezoelectric layer 101. Here, the effective acoustic velocities are the values obtained by converting the respective frequencies $f_d$ and $f_r$ into velocities using the acoustic wavelength λ. The thickness of the electrode fingers 3 is also normalized using the acoustic wavelength λ.

According to FIG. 8, it can be seen that relative frequency positions of the minimum propagation loss frequency $f_d$ and the resonance frequency $f_r$ can be adjusted by changing the thickness of the electrode fingers 3. For example, when the arrangement interval d of the electrode fingers 3 is 2 μm (the acoustic wavelength λ is 4 μm) to form the IDT electrode by the aluminum electrode fingers 3 of the film thickness 480 nm (12% of the acoustic wavelength λ), the effective velocity of the minimum propagation loss frequency $f_d$ is approximately 3620 m/s.

On the other hand, according to FIG. 7 described above, it can be read that the thickness of the piezoelectric layer 101 with which the plate wave spurious due to the slow shear wave SV1 becomes approximately 3620 m/s is 1.7 acoustic wavelengths. Therefore, when the actual dimension of the thickness of the piezoelectric layer 101 is about 6.8 μm, the plate wave spurious frequency and the minimum propagation loss frequency $f_d$ are matched.

Note that the frequency is the value obtained by dividing the velocity by the acoustic wavelength λ. Accordingly, when the (actual) velocities coincide with one another, the frequencies coincide with one another.

Here, similarly to the technique described in Japanese Patent No. 5713025 described above, when all the plate wave spuriouses are positioned outside the band it can be also seen that according to FIG. 7, the thickness of the piezoelectric layer 101 only needs to be around 2.4 μm (normalized plate thickness 0.6). However, assuming that the thickness of the piezoelectric layer 101 varies around ±0.2 μm, the following analysis result was obtained. When the thickness of the piezoelectric layer 101 is 2.4 μm, the variation of the resonance frequency $f_r$ becomes around 600 ppm.

In contrast to this, when the thickness of the piezoelectric layer 101 is 6.8 μm, the variation of the resonance frequency $f_r$ is kept around 100 ppm. Thus, the influence of the variation in manufacturing and processing of the piezoelectric layer 101 on the resonance frequency $f_r$ can be reduced.

Furthermore, from FIG. 7, as the thickness of the piezoelectric layer 101 increases, an inclination of the acoustic velocity of each plate wave spurious (that is, the frequency at which the spurious is generated) decreases. Therefore, it can be seen that the dependence of the frequency at which the plate wave spurious is generated decreases relative to the change in the plate thickness. In this regard as well, thickening the thickness of the piezoelectric layer 101 makes it easy to match the plate wave spurious frequency and the minimum propagation loss frequency $f_d$ and can decrease characteristic variation due to the variation in manufacturing.

Meanwhile, according to FIG. 7, when the modes of SHSAW and SVn (n=1, 2, and 3) approach, the mutual modes are joined. Thus, a frequency sensitivity of the main mode relative to the thickness of the piezoelectric layer 101 increases. From this, by selecting the thickness of the piezoelectric layer 101 such that the plate wave spurious of SV1 is lower than the resonance frequency and the plate wave spurious of SV2 is sufficiently higher than the resonance frequency, the influence of the plate thickness on a spurious strength and the resonance frequency can be lowered.

Specifically, with the plate thickness of around 1.2 to 1.8 acoustic wavelengths, the conditions such that the dependence of the plate wave spurious frequency of SV1 on the plate thickness is low, and the plate wave spurious frequency of SV2 is sufficiently higher than the resonance frequency can be selected.

Based on the way of thinking described above, FIG. 9 indicates admittance and conductance characteristics of the SAW device 1 according to the embodiment and a SAW device according to a comparative example using a conventional LT single crystal. The design in the embodiment is set by 42LT ((0°, 132°, 0°) in the Euler angle notation), 6.8 μm as the thickness of the piezoelectric layer 101, 480 nm (12% of the acoustic wavelength λ) as the thickness of the electrode fingers 3, a silicon substrate as the supporting substrate 102, and other conditions that are similar to the setting of the analysis conditions described above.

The comparative example is similar to the embodiment, except a point that the piezoelectric layer 101 of the 42LT alone without including the supporting substrate 102 is used (the thickness is 6.8 μm) or a point that the thickness of the electrode fingers 3 is 320 nm (8% of the acoustic wavelength λ).

Figure 9:
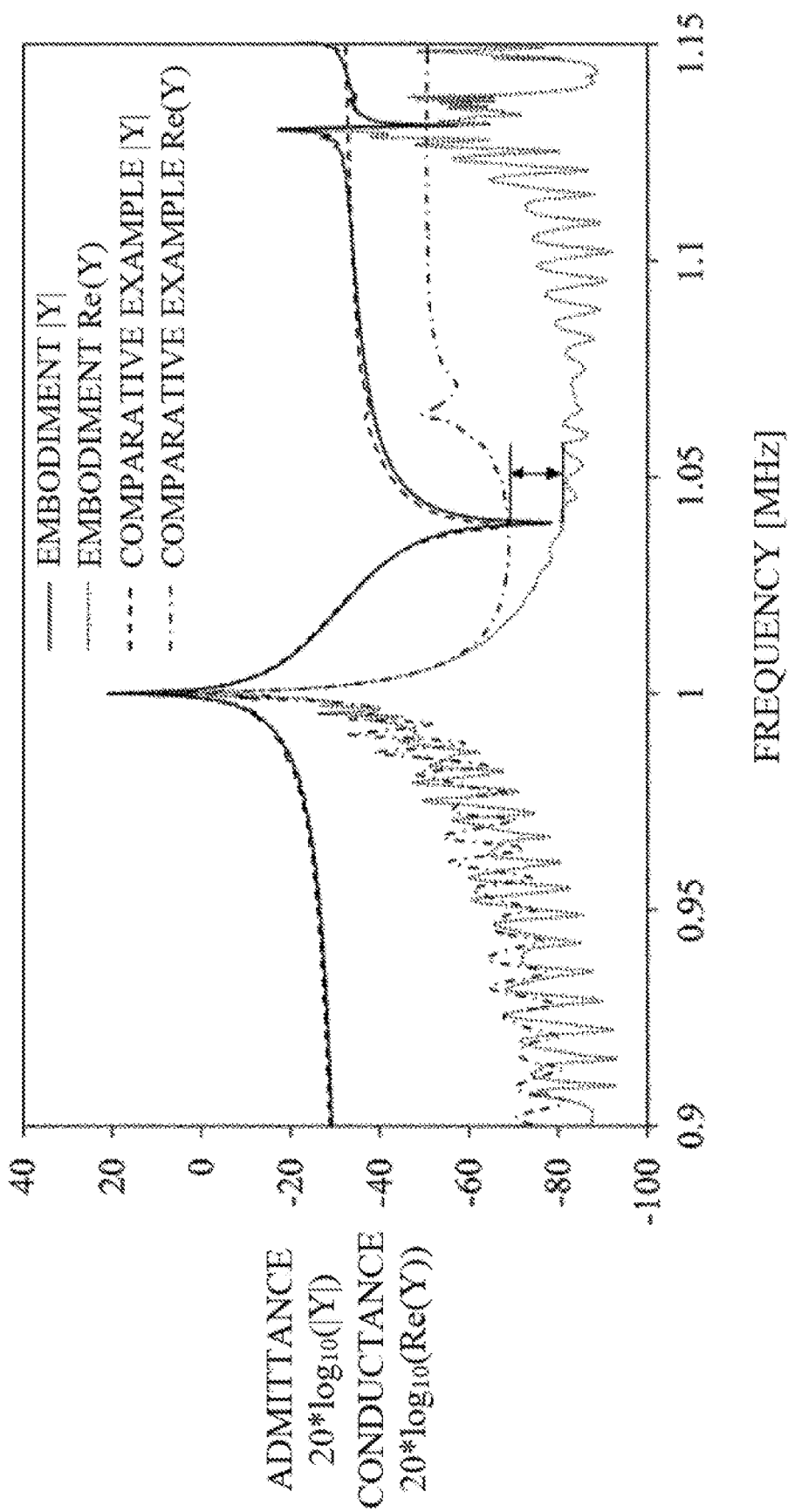
FIG. 9 is a characteristic diagram of the SAW device according to an embodiment and a comparative example.

In order to be easily compared, in FIG. 9, the horizontal axis is normalized such that the respective resonance frequencies of the embodiment and the comparative example become one. A small conductance value between the resonance frequency and the anti-resonance frequency means that its resonator has a small loss, and it can be seen that the conductance improves by 10 dB or more near the anti-resonance frequency (normalized frequency: 1.04) compared with the comparative example.

Additionally, looking at the analysis result in FIG. 9, the spurious is not generated near 905 MHz (0.966 as the normalized frequency) that corresponds to approximately 3620 m/s as the effective velocity of the plate wave spurious due to the slow shear wave SV1 in FIG. 7, and it can be seen that the design method of this example can suppress the plate wave spurious.

According to this embodiment, even when the thickness of the piezoelectric layer 101 exceeds one acoustic wavelength, the design conditions that suppress the spurious caused by the plate wave are selected, and thus the SAW device 1 that is easily manufactured and has a favorable characteristic can be obtained.

Here, "the spurious frequency and the minimum propagation loss frequency $f_d$ are matched" is not limited to a case where these frequencies strictly coincide with one another. The action "matching" these frequencies includes bringing the spurious frequency and the minimum propagation loss frequency $f_d$ close one another such that the spurious that would occur unless the thickness is adjusted as a result of deciding the plate thickness of the piezoelectric layer 101 based on the above-described way of thinking can be reduced to a degree not to cause a problem in practical use.

Next, design variables other than the thickness (plate thickness) of the piezoelectric layer 101 are confirmed.

The SAW device 1 of this example is in a non-leakage state of the SAW in the pass band of a filter circuit and the like that uses the SAW device 1 as a resonator (a state where the leaked elastic wave component is confined within the piezoelectric layer 101). In order to create this state, an acoustic velocity of the bulk wave of the constituent material of the supporting substrate 102 needs to be sufficiently fast. In this regard, the supporting substrate 102 needs to have an acoustic velocity around equal to or more than 1.05 times of the SAW of the main mode such that the degree can be in the non-leakage state between the resonance frequency and the anti-resonance frequency of at least the SAW device 1.

Considering that a ladder-type filter includes the SAW device 1 of this example, more preferably, it is preferred that the SAW is in the non-leakage state in a frequency band around double the interval between the resonance frequency and the anti-resonance frequency using the resonance frequency as a base point. In this regard, the supporting substrate 102 desirably has the acoustic velocity around equal to or more than 1.08 times of the SAW velocity of the main mode.

In this embodiment, Si is used for the supporting substrate 102. Its linear expansion coefficient is approximately 3 ppm/° C., and a linear expansion coefficient in the X-axis direction of 42LT is approximately 16 ppm/° C. Thus, it can be expected that the supporting substrate 102 functions to suppress the linear expansion of the thin piezoelectric layer 101. Consequently, frequency variation caused by the linear expansion is reduced, and improvement by around 13 ppm/° C. is expected as a temperature coefficient of frequency (TCF, frequency/temperature characteristic).

The reduction in the loss described using FIG. 9 and the above-described improvement in the frequency/temperature characteristic are not the effects specific to the case where Si is used as the constituent material of the supporting substrate 102. As the constituent material that has a sufficiently large acoustic velocity of the bulk wave and a small linear expansion coefficient and can be used for the SAW device 1 of this example, a supporting substrate material selected from a supporting substrate material group consisting of silicon (Si), silicon carbide (SiC), diamond (C), sapphire (single crystal $Al_2O_3$), Quartz crytstal ($SiO_2$), alumina (polycrystal $Al_2O_3$), and spinel ($MgAl_2O_4$) can be exemplified.

Figure 10:
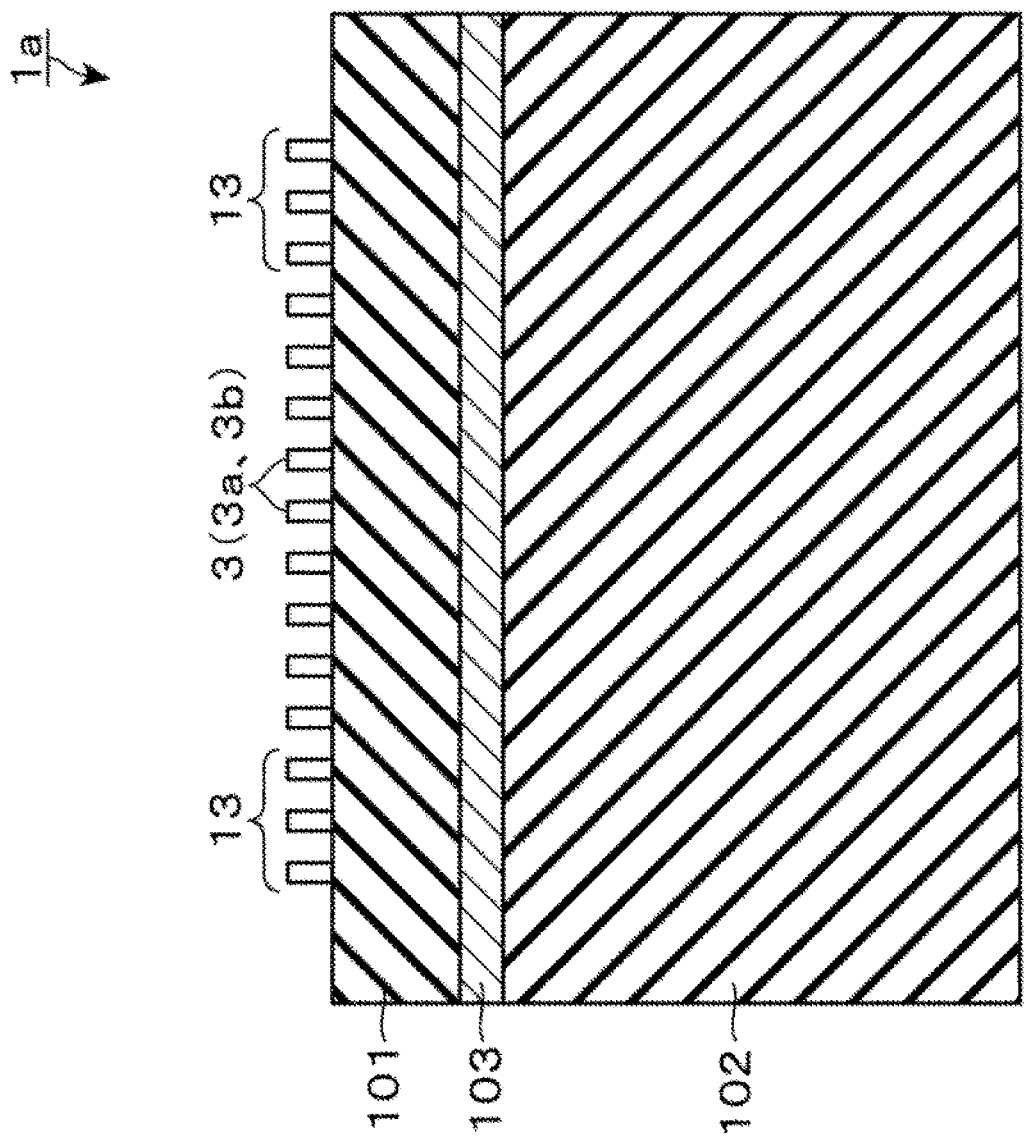
FIG. 10 is a longitudinal sectional side view of a SAW device that includes a high-acoustic-velocity layer.

Additionally, even when the constituent material of the supporting substrate 102 does not satisfy the above-described requirement regarding the acoustic velocity of the bulk wave, as illustrated in FIG. 10, a SAW device 1a may be configured by bonding the piezoelectric layer 101 on laminated layers of a dielectric film that has a fast acoustic velocity of the bulk wave, such as aluminum oxide ($Al_2O_3$), titanium oxide ($TiO_2$), and aluminum nitride (AlN), or a metal film (high-acoustic-velocity layer 103), such as beryllium. In this case, on the high-acoustic-velocity layer 103 located at a lower portion of the piezoelectric layer 101, the leaky component becomes evanescent and reflected. The high-acoustic-velocity layer 103 is appropriate with around equal to or more than one acoustic wavelength. Additionally, a material other than those included here can be applied to the SAW device 1 and 1a of this example, as long as having physical properties, such as an appropriate density and an elastic modulus.

Next, the following describes that even when a cut angle of $LiTaO_3$ as the constituent material of the piezoelectric layer 101 is changed, the argument similar to that of the example described using FIG. 6 to FIG. 9 is satisfied.

Here, as indicated in FIG. 7, the frequency at which the plate wave spurious is generated is largely dependent on the thickness of the piezoelectric layer 101, while being less dependent on the thickness of the electrode fingers 3. On the other hand, it is known that for the dependence of the SAW frequency of the main mode, the dependence on the thickness of the electrode fingers 3 is large, and for the minimum propagation loss frequency fd, the dependence on the cut angle of $LiTaO_3$ and the thickness of the electrode fingers 3 is large.

Then, changing the cut angle of $LiTaO_3$ used for the piezoelectric layer 101 corresponding to a bandwidth of the filter circuit that uses the SAW device 1 of this example as the resonator allows for obtaining a preferred electromechanical coupling coefficient. When the thickness of the electrode fingers 3 and the plate thickness of the piezoelectric layer 101 can be determined corresponding to the cut angle desired to be used, the spurious near the resonance/anti-resonance frequency can be suppressed similarly to the example described above.

For example, when 48°-rotated Y-cut X-propagation ((0°, 138°, 0°) in the Euler angle notation) $LiTaO_3$ is exemplified, an analysis was performed by setting the thickness h of the electrode fingers 3 to be 440 nm (11% of the acoustic wavelength λ), changing the thickness H of the piezoelectric layer 101 to 4.6, 5, and 5.4 μm, and setting other conditions identical to the analysis conditions described above.

Figure 11A:
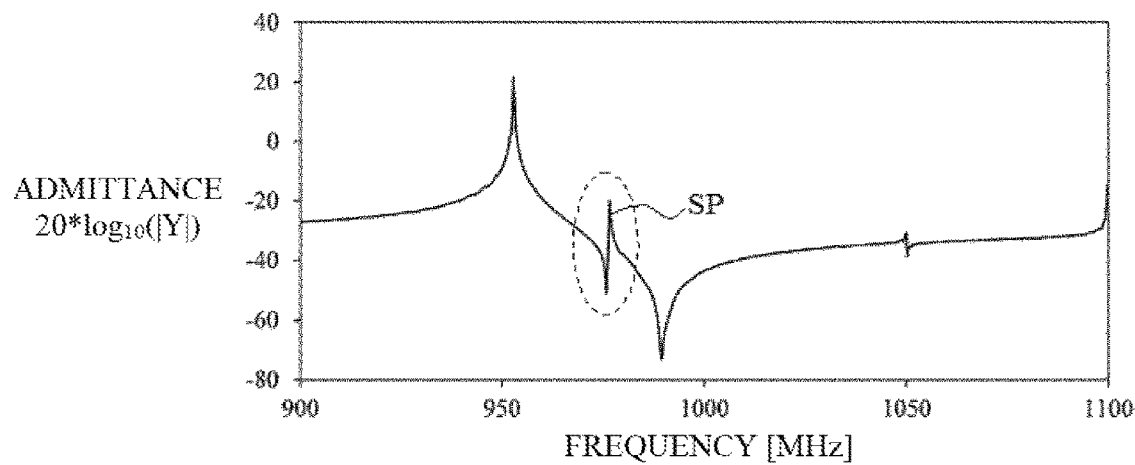
FIG. 11A to FIG. 11C are admittance characteristic diagrams when the minimum propagation loss frequency is changed.
Figure 11B:
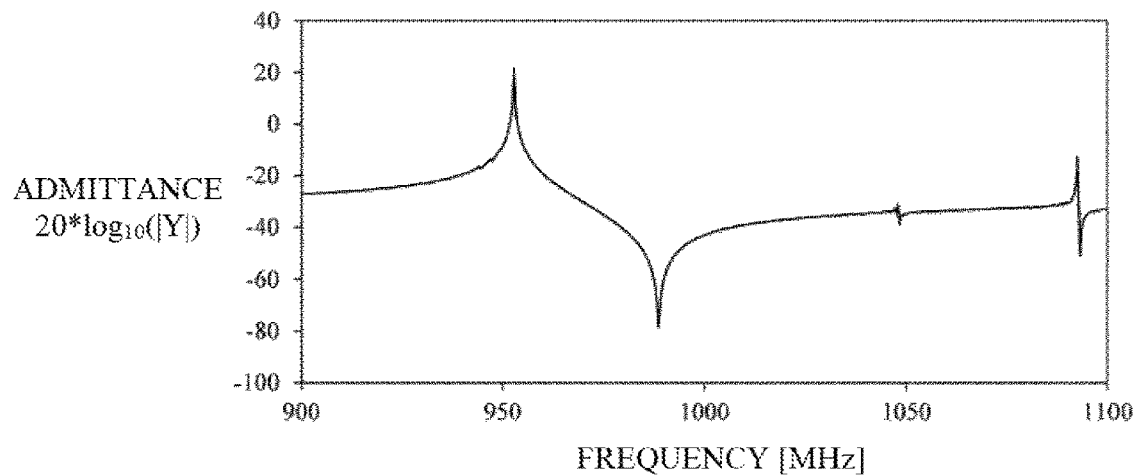
Figure 11C:
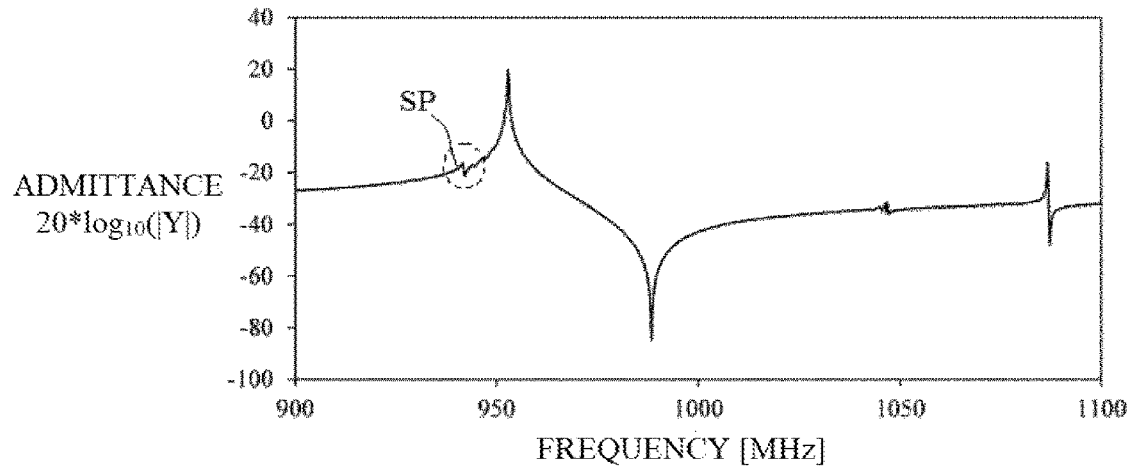

The respective analysis results are indicated in FIG. 11A to FIG. 11C. In FIG. 11A (the thickness H of the piezoelectric layer 101 is 4.6 μm) and FIG. 11C (the thickness H of the same is 5.4 μm), the plate wave spurious SP is generated at positions surrounded by dashed lines near the resonance frequency. Meanwhile, in FIG. 11B (the plate thickness H of the same is 5 μm), the characteristic where the spurious disappears is obtained.

Figure 12:
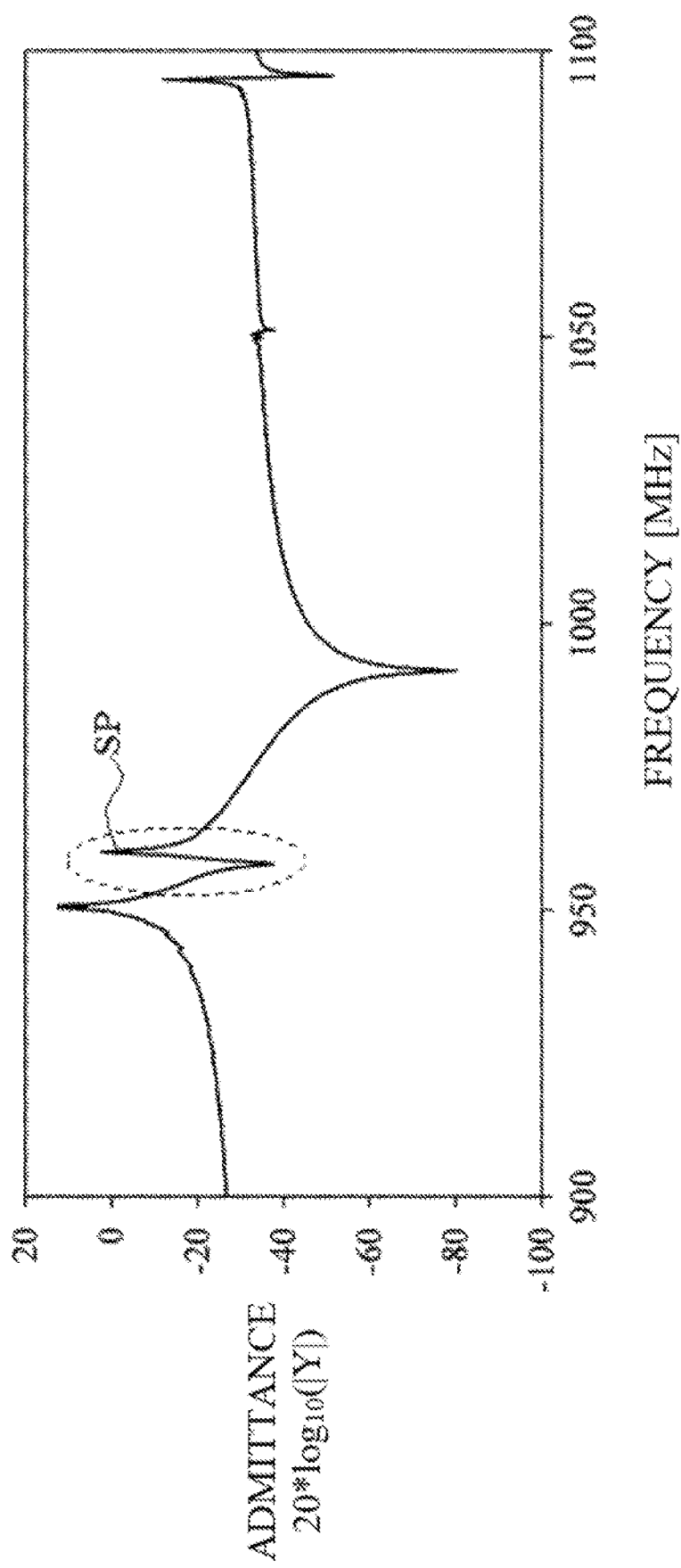
FIG. 12 is an admittance characteristic diagram when a cut of the piezoelectric material is changed.

Here, FIG. 12 indicates an analysis result in a case where the piezoelectric layer 101 is configured using 42LT, instead of 48LT, under the same design conditions in FIG. 11B. While the design is different only in the cut angle of $LiTaO_3$, it can be seen that this causes a large spurious SP near 960 MHz.

Additionally, FIG. 13 indicates a mode chart on the piezoelectric layer 101 of 48LT (the thickness of the electrode finger 3 is 440 nm), and FIG. 14 indicates a plot of effective acoustic velocities of the minimum propagation loss frequency fd and the resonance frequency fr on respective film thicknesses of the electrode fingers 3 formed on the 48LT piezoelectric layer 101. From these diagrams, in the case where 48LT is used as the constituent material of the piezoelectric layer 101, when the thickness of the electrode fingers 3 is 440 nm (11% of the acoustic wavelength) and the plate thickness of the piezoelectric layer 101 is 5 μm (1.25 acoustic wavelengths), both the effective velocity of the minimum propagation loss frequency fd and the velocity of the plate wave spurious are approximately 3830 m/s, and these frequencies can be matched.

From the above-described analysis result, it can be seen that even when the cut angle of $LiTaO_3$ is changed, the spurious can be suppressed by appropriately setting the thickness of the electrode fingers 3 and the thickness of the piezoelectric layer 101. In other words, for $LiTaO_3$ that has any cut angle, the SAW device 1 in which the spurious is suppressed can be obtained by appropriately selecting the thickness of the electrode fingers 3 and the plate thickness of the piezoelectric layer 101. Therefore, it becomes possible to select the cut angle of the piezoelectric layer 101 corresponding to the frequency bandwidth of the filter circuit to be designed.

As an example of a representative cut angle in a case where the piezoelectric layer 101 includes $LiTaO_3$, the case in a range of (0±10°, 120 to 144°, 0±10°) in the Euler angle notation can be exemplified.

Additionally, since a leaky surface acoustic wave that is excited on the piezoelectric layer 101 of a rotated Y-cut $LiNbO_3$ has a minimum propagation loss frequency fd, the above-described method can be applied.

As an example of a representative cut angle in a case where the piezoelectric layer 101 includes $LiNbO_3$, the case in a range of (0±10°, 129 to 156°, 0±10°) or in a range of (0±10°, −5 to 25°, 0±10°) in the Euler angle notation can be exemplified.

As examined above, in the SAW device 1, the thickness of the piezoelectric layer 101 is proportionate to the wavelength of the surface acoustic wave that is excited on the IDT electrode. Then, assuming a case where the piezoelectric layer 101 becomes the thinnest, an actual size on 2.6 GHz that is around the upper limit in an applicable scope of the SAW device 1 is considered. In this case, since the wavelength of the SAW becomes around 1.5 μm, the plate thickness of the piezoelectric layer 101 in the SAW device 1 becomes 1.5 acoustic wavelengths, that is, around 2.2 μm, ensuring the plate thickness equal to or more than 1 μm.

In a conventional structure in which the piezoelectric layer 101 having the plate thickness equal to or less than one acoustic wavelength is laminated, around 0.3 acoustic wavelengths is exemplified, resulting in the structure that falls significantly below 1 μm (for example, Japanese Patent No. 5713025). From this, superiority in processing of the SAW device 1 of this example can be shown. Additionally, even with around 1 GHz that is a practical and relatively low frequency, the plate thickness of the conventional SAW device is around 1 μm, and required deviation is small. Accordingly, it can be seen that the degree of difficulty in processing is very high.

When considering application to an electronic component that has a duplexer and a multiplexer functions, the spurious in a pass band of the filter circuit to be combined leads to degradation of isolation. Thus, it is preferred that the spurious does not exist not only near the resonance frequency but also over wide frequencies.

Figure 15:
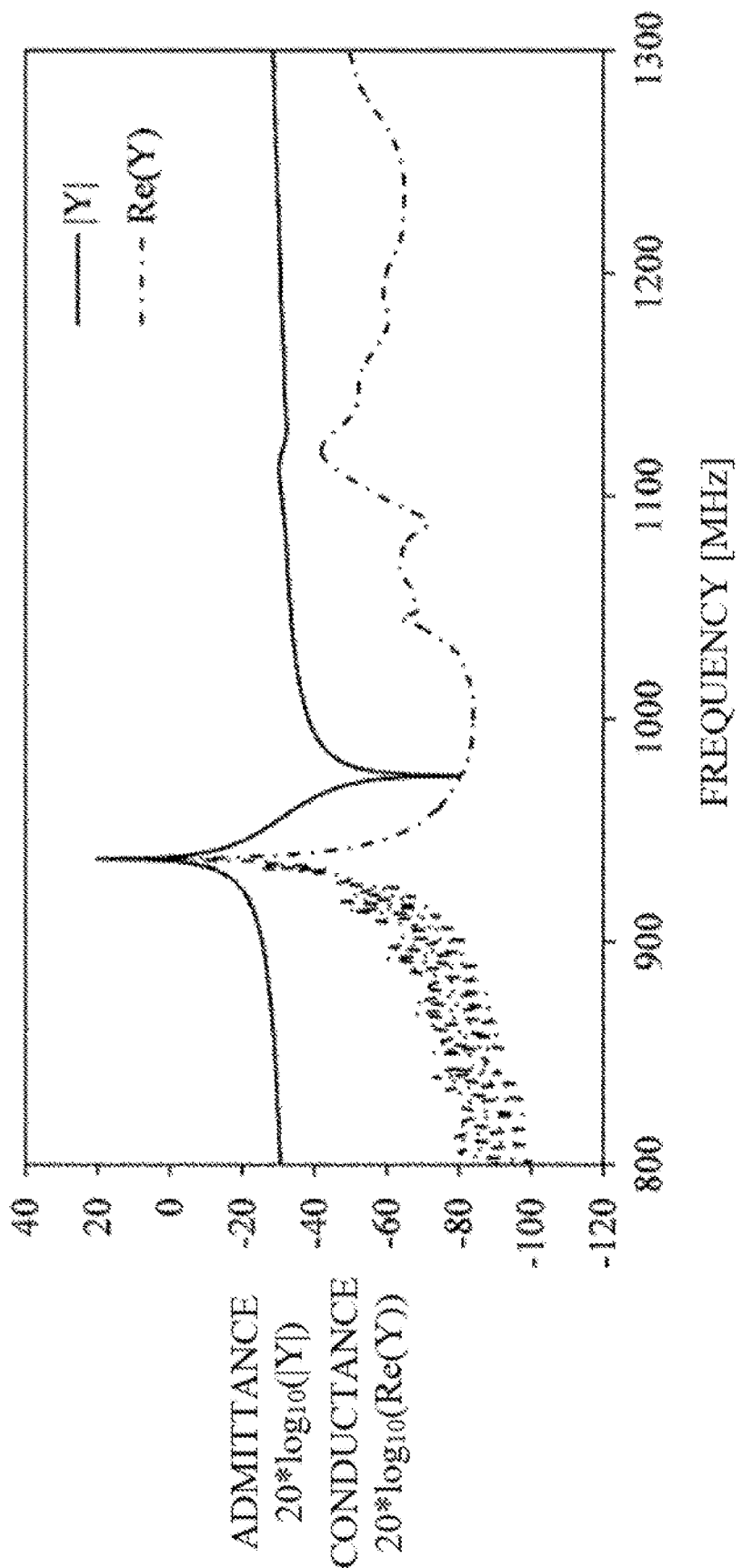
FIG. 15 is a characteristic diagram of the SAW device that uses crystal as the support substrate.

In this regard, as illustrated in FIG. 15 for example, using crystal ((0°, 90°, 105°) in the Euler angle notation) as the supporting substrate 102 ensures obtaining a device that improves an insertion loss equivalent to that of the above-described FIG. 9, while suppressing the spurious even in a frequency sufficiently higher than the resonance frequency. At this time, the design used for the analysis is, in addition to the analysis conditions described above, such that the thickness of the 42LT piezoelectric layer 101 is 5.2 μm, the thickness of the electrode fingers 3 is 480 nm (12% of the acoustic wavelength λ), and the supporting substrate 102 is a crystal.

Figure 16:
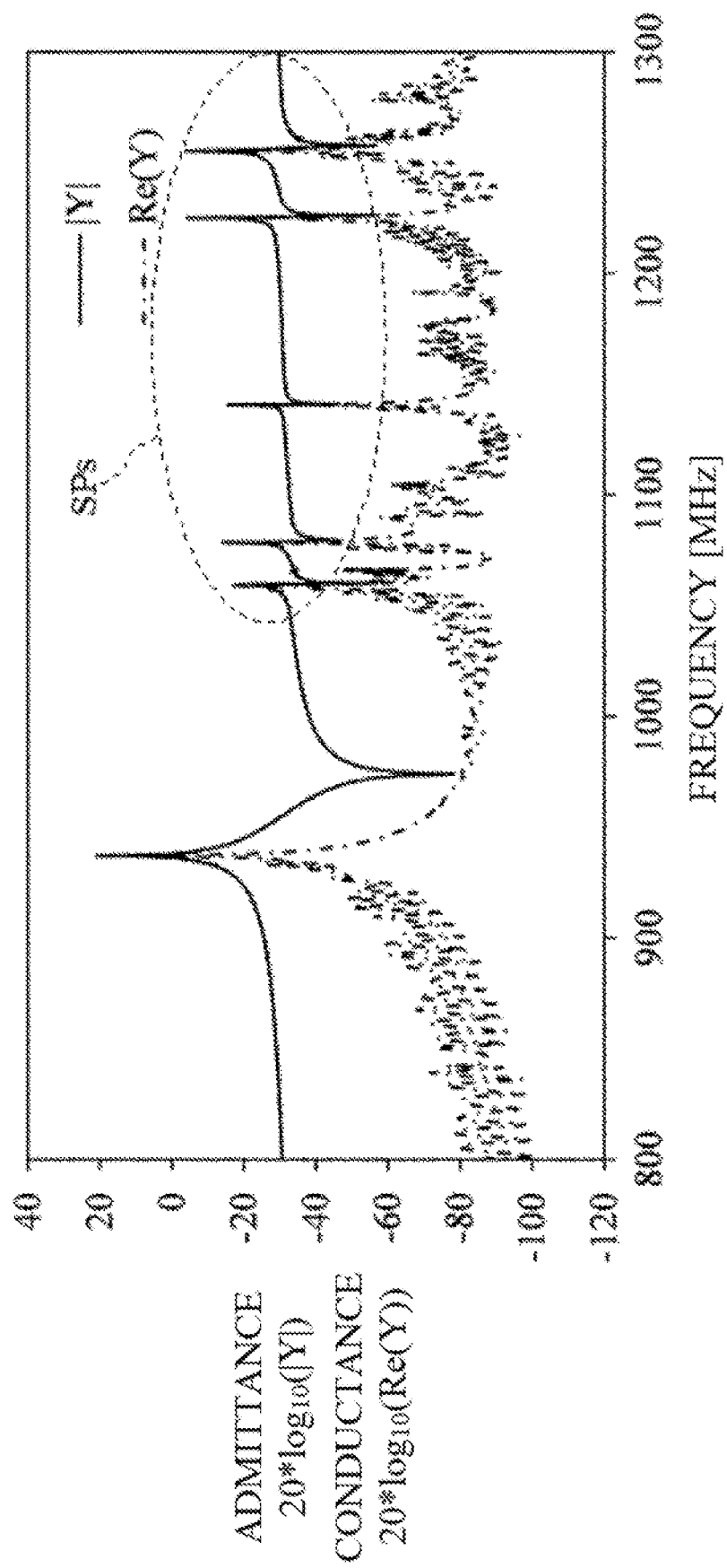
FIG. 16 is a characteristic diagram of the SAW device that uses silicon as the support substrate.

FIG. 16 is a characteristic diagram when the thickness of the 42LT piezoelectric layer 101 is 6.8 μm and Si is used as the constituent material of the supporting substrate 102. While the spurious does not exist near the resonance/anti-resonance frequency to have a sufficient characteristic to form a pass band of the filter, a plurality of spuriouses SPs caused by the plate wave due to the slow shear wave and the fast shear wave are generated in and after 1,050 MHz.

In the example of FIG. 11B in which Si is similarly used as the constituent material of the supporting substrate 102, the plate wave spurious in high frequencies can be suppressed. This is because the plate wave leaks inside the supporting substrate 102 to make the confinement of the plate wave very weak, and the spurious caused by it can be significantly suppressed.

This phenomenon is not limited to a case where the supporting substrate 102 is constituted of crystal as the example illustrated in FIG. 15, but is ensured by appropriately selecting a propagation velocity (acoustic velocity) of the bulk wave in the supporting substrate 102 as described above. As a more specific selection method of the acoustic velocity, the constituent material of the supporting substrate 102 should be selected such that the SAW is confined in the front surface (becomes in the non-leakage state). The appropriate constituent material is selected to make the acoustic velocity of the bulk wave in the supporting substrate 102 equal to or more than around 1.05 times of the SAW velocity. Furthermore, the slower one of the acoustic velocity of a second order plate wave due to the slow shear wave that propagates in the piezoelectric layer 101 or the acoustic velocity of a first order plate wave due to the fast shear wave needs to be a higher acoustic velocity than the bulk wave in the supporting substrate 102 such that the plate wave in high frequencies to be the spurious becomes a leakage mode.

Actually, the slowest bulk wave velocity of quartz crystal with this cut angle (0°, 90°, 105°) by the analysis is around 4100 m/s (1.09 times of the SAW velocity). Additionally, since the second order plate wave velocity due to the slow shear wave that propagates in the piezoelectric layer 101 is around 4480 m/s, the above-described requirement is satisfied.

Meanwhile, in the example of FIG. 16, the slowest bulk wave velocity of Si is around 5860 m/s (1.56 times of the SAW velocity). Additionally, since the second order plate wave velocity due to the slow shear wave that propagates in the piezoelectric layer 101 is 4220 m/s, the above-described requirement is not satisfied.

Figure 17:
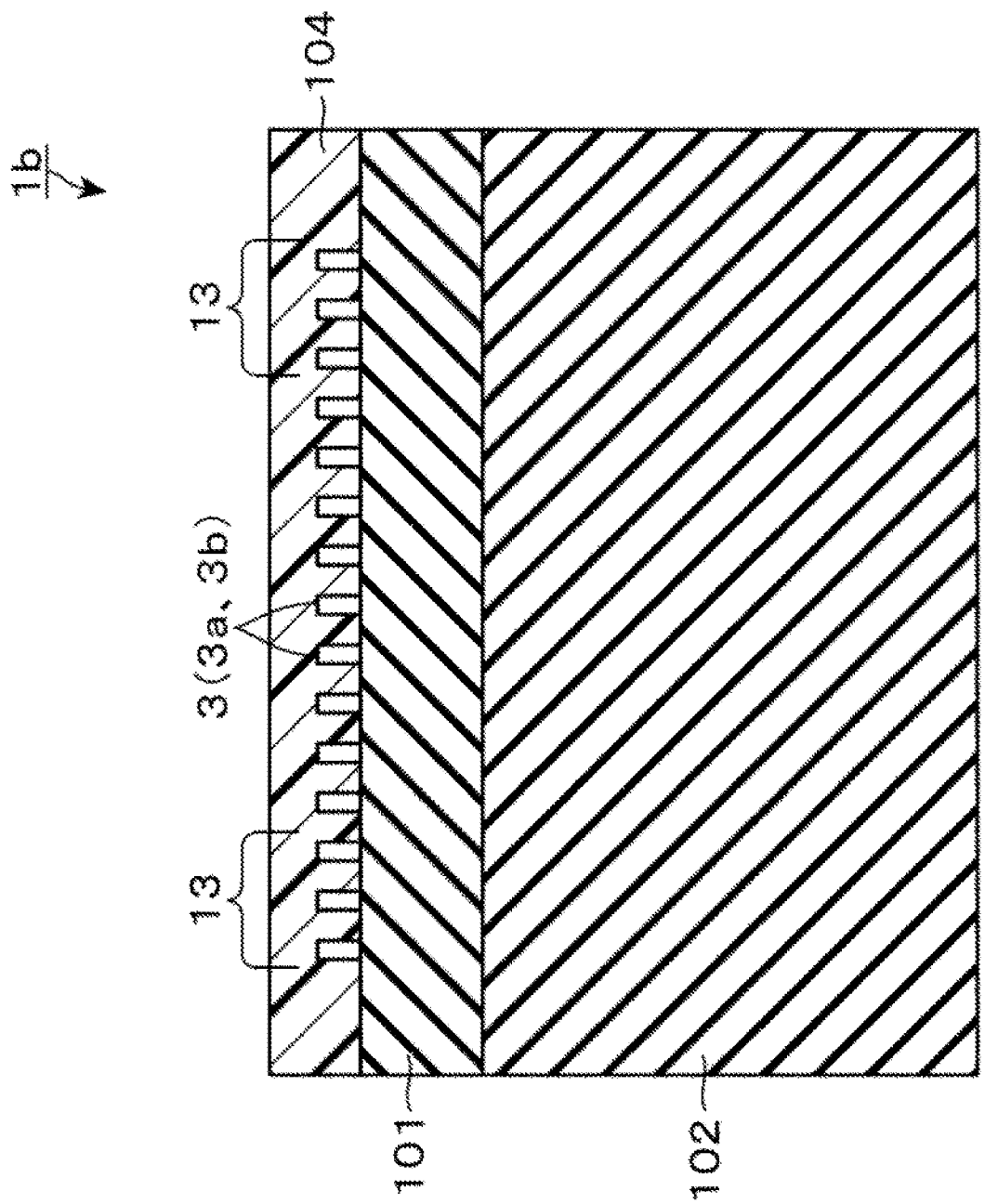
FIG. 17 is a longitudinal sectional side view of a SAW device according to another example.

As an application to this example, similarly to an ordinary surface acoustic wave device, it is thought that the dielectric film that has a single layer of a dielectric material selected from a dielectric material group consisting of silicon oxide, silicon oxynitride, and silicon nitride or a laminated structure including a plurality of these is formed on the IDT electrode as a passivation film 104 to improve weather resistance and environmental resistance (a SAW device 1b of FIG. 17). Additionally, it is known that at this time, in the passivation film 104, using silicon oxide or silicon oxynitride that has a frequency/temperature characteristic opposite to those of $LiTaO_3$ and $LiNbO_3$ causes an effect to reduce frequency variation due to temperature variation (loading of the dielectric film). This contributes to improvement in the temperature characteristic of the surface acoustic wave device.

Next, a description will be given of an example in which a filter circuit is constituted using the above-described SAW devices 1, 1a, and 1b.

Figure 18:
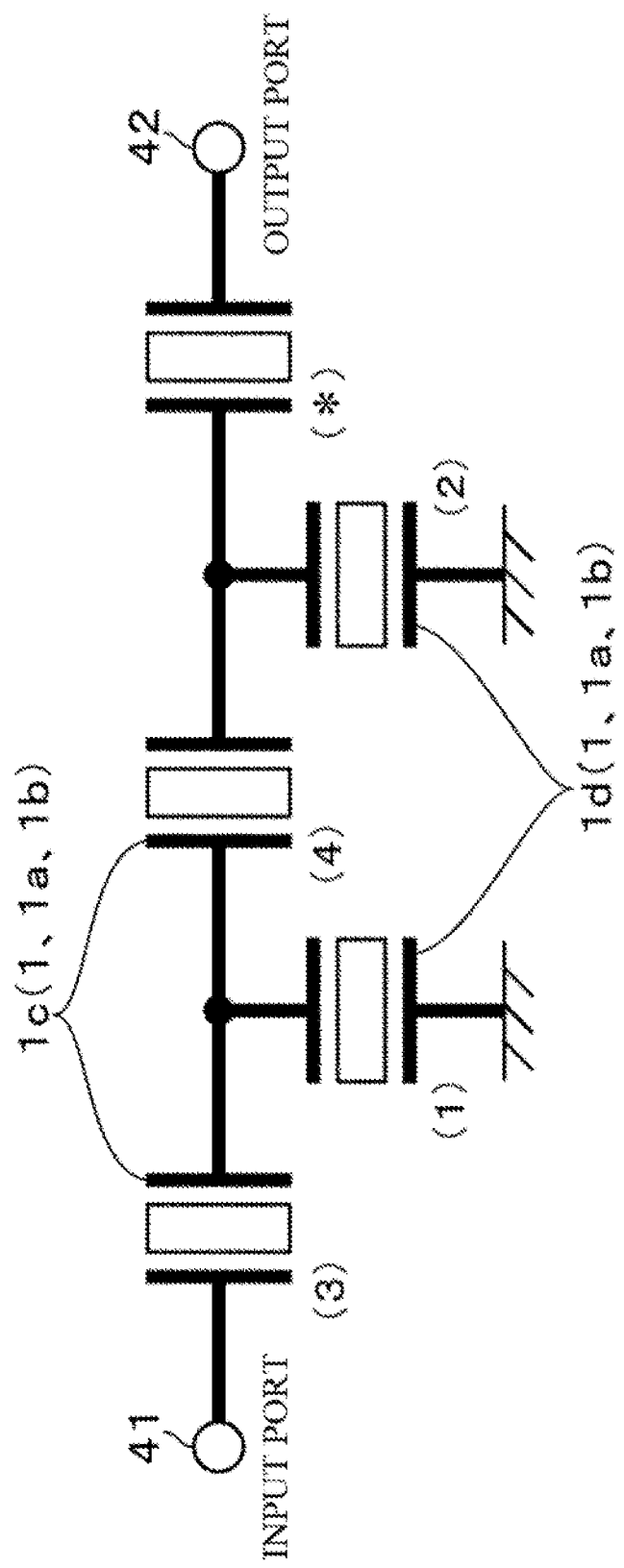
FIG. 18 is a schematic diagram of a filter circuit that uses the SAW device of this example as a resonator.

As a configuration of the filter circuit that obtains a desired filter property, as in FIG. 18, one or more SAW devices 1, 1a, and 1b of this example are connected each in series and in parallel between an input port 41 and an output port 42 to be defined as a serial resonator 1c and a parallel resonator 1d. Then, there is known a ladder-type filter that is designed such that a resonance frequency of the serial resonator 1c and an anti-resonance frequency of the parallel resonator 1d almost coincide with one another.

The circuit configuration indicated in FIG. 18 is one example, it is obviously possible to change the number of the SAW device 1, and to adjust and improve a filter property by a combination with a double mode SAW (DMS) filter and an additional circuit, such as an inductor and a capacitor. In this case, since the SAW wavelengths of the serial resonator 1c and the parallel resonator 1d are different, the thicknesses H of the piezoelectric layers 101 normalized by the SAW wavelengths are different from one another. Meanwhile, since these serial resonator 1c and parallel resonator 1d are simultaneously patterned on, for example, the common piezoelectric layer 101, it is sometimes difficult to have mutually different thicknesses h of the electrode fingers 3.

Figure 19:
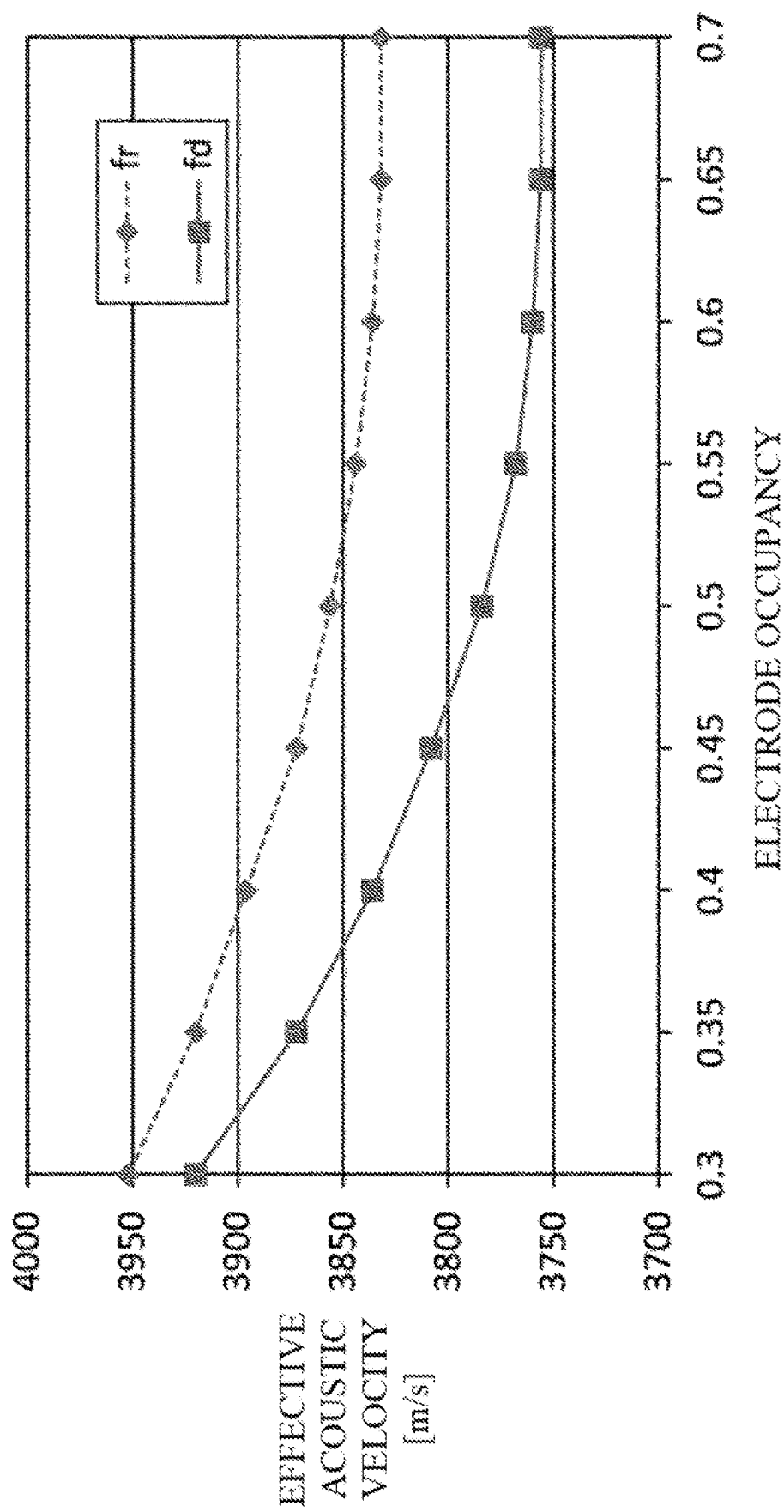
FIG. 19 is a characteristic diagram illustrating a relation between an electrode occupancy and an effective acoustic velocity in the resonance frequency and the minimum propagation loss frequency.

Thus, it is necessary to have a design variable that can suppress the plate wave spurious in both the serial resonator 1c and the parallel resonator 1d even in such a case. In this respect, the example indicated in FIG. 19 indicates that differentiating electrode occupancies of the respective serial resonator 1c and the parallel resonator 1d ensures adjusting the relative frequency positions of the minimum propagation loss frequency $f_d$ and the resonance frequency $f_r$. Note that in this analysis, the thickness h of the electrode fingers 3 is 480 nm (12% of the acoustic wavelength λ).

Since the wavelength of the low frequency parallel resonator 1d becomes longer, the normalized plate thickness H of the piezoelectric layer 101 becomes thinner and the frequency at which the plate wave spurious is generated is relatively higher relative to the resonance frequency. That is, the electrode occupancy of the electrode fingers 3 in the serial resonator 1c is set to be larger than that of the parallel resonator 1d (in other words, the electrode occupancy of the electrode fingers 3 in the parallel resonator 1d is set to be smaller than that of the serial resonator 1c). Consequently, a relative frequency of the minimum propagation loss frequency fd relative to the resonance frequency of the parallel resonator 1d becomes higher, allowing for suppressing the spurious for both and ensuring a design appropriate for the filter.

Additionally, a reference when resonators that have different electrode occupancies are arranged in a filter circuit is not limited to the example in which the electrode occupancy of the serial resonator 1c is set to be larger than that of the parallel resonator 1d as described above. For example, corresponding to a resonance frequency, a resonator that cause the electrode occupancy to differ may be selected.

For example, the filter circuit that includes four resonators (serial resonators 1c and parallel resonators 1d) for which reference numerals (1) to (4) are assigned in FIG. 18 is examined (in this example, the serial resonator 1c for which a reference numeral (*) is assigned is assumed not to be disposed). Then, the resonance frequencies of these resonators 1c and 1d are assumed to increase in the order of "(1)<(2)<(3)<(4)."

At this time, for electrode occupancies of the electrode fingers 3, for example in a manner as "(1)=(2)=(4)<(3)" and "(1)=(2)=(3)<(4)," the resonator 1c that has an electrode occupancy larger than those of the other resonators 1d and 1c that have the different resonance frequencies may be disposed. Additionally, not limited to one piece, but a plurality of pieces of the resonators 1c that have large electrode occupancies, in a manner as "(1)=(2)<(3)<(4)," may be disposed.

Furthermore, in the example of the filter circuit with the reference numerals (1) to (4), for the electrode occupancies, for example in a manner as "(2)<(1)=(4)=(3)" and "(1)<(2)=(3)=(4)," the resonator 1d that has an electrode occupancy smaller than those of other resonators 1d and 1c that have the different resonance frequencies may be disposed. The resonator 1d that has a small electrode occupancy is not limited to one piece, but a plurality of pieces may be disposed in a manner as "(1)<(2)<(3)=(4)."

Other than these, when a duplexer and a multiplexer that include a plurality of ladder-type filters is constituted, only for one or a plurality of ladder-type filters that are preliminarily selected, the electrode occupancies of the serial resonators 1c included in the selected filters may be set to be larger. In contradiction to this, the electrode occupancies of the parallel resonators 1d included in the selected filters may be set to be smaller.

The resonance frequencies of the serial resonators 1c and the parallel resonators 1d differ one another between the ladder-type filters in the duplexer and the multiplexer in some cases. Therefore, the above-described cases can be said to be the examples of the filter circuit that includes the serial resonators 1c that have the electrode occupancies larger than and the parallel resonators 1d that have the electrode occupancies smaller than the other resonators 1d and 1c that have the different resonance frequencies.

As described above with the specific examples, setting the design variables selected from a design variable group consisting of the thickness H of the piezoelectric layer 101, the thickness h of the electrode fingers 3, and the electrode occupancy ensures adjusting the minimum propagation loss frequency $f_d$.

Using the SAW device 1, 1a, and 1b of this example ensures obtaining the favorable filter circuit that does not generate the spurious caused by the plate wave in the pass band. Consequently, by applying this filter circuit, an electronic component that has a multiplexer and a multiple filter functions can be constituted.

The above-described surface acoustic wave device may include the following configuration.

(a) The design variable is selected from a design variable group consisting of a thickness of the piezoelectric material layer, a thickness of the electrode fingers, an electrode occupancy that is a proportion of an electrode finger width occupying in the arrangement interval of the electrode fingers of the surface acoustic wave device.

(b) The supporting substrate includes a supporting substrate material selected from a supporting substrate material group consisting of silicon, silicon carbide, diamond, sapphire, quartz crystal, alumina, and spinel.

(c) A high-acoustic-velocity layer is formed between the supporting substrate and the piezoelectric material layer. The high-acoustic-velocity layer includes a dielectric or a metallic material and has a thickness equal to or more than one time of the acoustic wavelength.

(d) When the piezoelectric material layer is directly formed on an upper surface of the supporting substrate, a linear expansion coefficient of the supporting substrate is smaller than a linear expansion coefficient in a propagation direction of the leaky surface acoustic wave in the piezoelectric material layer.

(e) The piezoelectric material layer includes $LiTaO_3$, and has a cut angle in a range of (0±10°, 120 to 144°, 0±10°) in an Euler angle notation. At this time, the electrode finger includes an electrode material including aluminum and has a film thickness equal to or more than 9% of the acoustic wavelength. Further, at this time, a thickness of the piezoelectric material layer is in a range of 1.2 to 1.8 times of the acoustic wavelength.

(f) The piezoelectric material layer includes $LiNbO_3$ and has a cut angle in a range of (0±10°, 129 to 156°, 0±10°) or in a range of (0±10°, −5 to 25°, 0±10°) in an Euler angle notation.

(g) A dielectric film that has one layer or a plurality of layers are loaded on an upper surface side of the plurality of electrode fingers and the reflectors. At this time, at least one layer in the dielectric film includes a dielectric selected from a dielectric material group consisting of silicon oxide, silicon oxynitride, and silicon nitride.

(h) An acoustic velocity when a shear bulk wave propagates in the supporting substrate is slower than a slower one of an acoustic velocity of a second order plate wave due to a slow shear wave or an acoustic velocity of a first order plate wave due to a fast shear wave in the piezoelectric material layer.

(i) The piezoelectric material layer includes $LiTaO_3$ and has a cut angle in a range of (0±10°, 120 to 144°, 0±10°) in an Euler angle notation, and the supporting substrate is crystal.

Additionally, the filter circuit includes a plurality of the above-described surface acoustic wave devices as resonators. Here, when a proportion of an electrode finger width occupying in the arrangement interval of the electrode fingers of the surface acoustic wave device is referred to as an electrode occupancy, the filter circuit has serial resonators and one or more parallel resonators. The serial resonators are one or more of the resonators that are connected in series to an input/output terminal. The parallel resonators are the resonators that are connected in parallel to the serial resonators. The serial resonators have the electrode occupancy larger than the electrode occupancy of the parallel resonators. Alternatively, the filter circuit, which includes two or more resonators that have resonance frequencies different from one another, includes a resonator having the electrode occupancy larger than the electrode occupancy of another resonator having a different resonance frequency or includes a resonator having the electrode occupancy smaller than the electrode occupancy of another resonator having a different resonance frequency.

The electronic component includes a plurality of combinations of the above-described filter circuits, and the electronic component functions as a multiple filter or a multiplexer.

With the disclosure, even when the thickness of the piezoelectric material layer exceeds one time of the acoustic wavelength, design conditions that suppress the spurious are selected, thus ensuring obtaining the surface acoustic wave device that is easily manufactured and has a favorable property.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface acoustic wave device comprising:
   a piezoelectric material layer disposed on a supporting substrate;
   a pair of busbars formed on an upper surface of the piezoelectric material layer;
   a plurality of electrode fingers that mutually extend in a comb shape from the respective busbars toward the opposed busbars; and
   reflectors arranged on both sides of formation regions of the plurality of electrode fingers, wherein
   the piezoelectric material layer has a thickness that is in a range of 1 to 2.5 times of an acoustic wavelength specified based on an arrangement interval of the plurality of electrode fingers,
   a main mode of an elastic wave excited on the piezoelectric material layer by the plurality of electrode fingers is a leaky surface acoustic wave,
   a design variable is set such that in the leaky surface acoustic wave, a minimum propagation loss frequency where a propagation loss becomes minimum and a frequency of a plate wave spurious formed due to a slow shear wave excited together with the leaky surface acoustic wave are matched, and
   a propagation velocity of a slowest bulk wave of an elastic wave that propagates in a lower layer of the piezoelectric material layer is equal to or more than 1.05 times of a velocity of the leaky surface acoustic wave.

2. The surface acoustic wave device according to claim 1, wherein
   the design variable is selected from a design variable group consisting of a thickness of the piezoelectric material layer, a thickness of the plurality of electrode fingers, an electrode occupancy that is a proportion of an electrode finger width occupying in the arrangement interval of the electrode fingers of the surface acoustic wave device.

3. The surface acoustic wave device according to claim 1, wherein
   the supporting substrate includes a supporting substrate material selected from a supporting substrate material group consisting of silicon, silicon carbide, diamond, sapphire, quartz crystal, alumina, and spinel.

4. The surface acoustic wave device according to claim 1, wherein
   a high-acoustic-velocity layer is formed between the supporting substrate and the piezoelectric material layer, the high-acoustic-velocity layer includes a dielectric or a metallic material and having a thickness equal to or more than one time of the acoustic wavelength.

5. The surface acoustic wave device according to claim 1, wherein
   when the piezoelectric material layer is directly formed on an upper surface of the supporting substrate, a linear expansion coefficient of the supporting substrate is smaller than a linear expansion coefficient in a propagation direction of the leaky surface acoustic wave in the piezoelectric material layer.

6. The surface acoustic wave device according to claim 1, wherein
   the piezoelectric material layer includes LiTaO$_3$ and has a cut angle in a range of (0±10°, 120 to 144°, 0±10°) in an Euler angle notation.

7. The surface acoustic wave device according to claim 6, wherein
   the plurality of electrode fingers are constituted by an electrode material including aluminum and has a film thickness equal to or more than 9% of the acoustic wavelength.

8. The surface acoustic wave device according to claim 7, wherein
   the thickness of the piezoelectric material layer is in a range of 1.2 to 1.8 times of the acoustic wavelength.

9. The surface acoustic wave device according to claim 1, wherein
   the piezoelectric material layer includes LiNbO$_3$ and has a cut angle in a range of (0±10°, 129 to 156°, 0±10°) or in a range of (0±10°, −5 to 25°, 0±10°) in an Euler angle notation.

10. The surface acoustic wave device according to claim 1, wherein
    a dielectric film that has one layer or a plurality of layers are loaded on an upper surface side of the plurality of electrode fingers and the reflectors.

11. The surface acoustic wave device according to claim 10, wherein
    at least one layer in the dielectric film includes a dielectric selected from a dielectric material group consisting of silicon oxide, silicon oxynitride, and silicon nitride.

12. The surface acoustic wave device according to claim 10, wherein the piezoelectric material layer includes $LiTaO_3$ and has a cut angle in a range of (0±10°, 120 to 144°, 0±10°) in an Euler angle notation, and the supporting substrate is a crystal.

13. The surface acoustic wave device according to claim 1, wherein
an acoustic velocity when a shear wave bulk wave propagates in the supporting substrate is slower than a slower one of an acoustic velocity of a second order plate wave due to a slow shear wave or an acoustic velocity of a first order plate wave due to a fast shear wave in the piezoelectric material layer.

14. A filter circuit comprising
a plurality of the surface acoustic wave devices according to claim 1 as resonators.

15. The filter circuit according to claim 14, wherein
when a proportion of an electrode finger width occupying in the arrangement interval of the plurality of electrode fingers of the surface acoustic wave device is referred to as an electrode occupancy,
the filter circuit has serial resonators and one or more parallel resonators, the serial resonators are one or more of the resonators that are connected in series to an input/output terminal, the parallel resonators are the resonators that are connected in parallel to the serial resonators, and the serial resonators have an electrode occupancy larger than an electrode occupancy of the parallel resonators.

16. The filter circuit according to claim 14, wherein
when a proportion of an electrode finger width occupying in the arrangement interval of the plurality of electrode fingers of the surface acoustic wave device is referred to as an electrode occupancy,
the filter circuit includes two or more resonators that have resonance frequencies different from one another and includes a resonator having an electrode occupancy larger than an electrode occupancy of another resonator having a different resonance frequency.

17. The filter circuit according to claim 14, wherein
when a proportion of an electrode finger width occupied in the arrangement interval of the plurality of electrode fingers of the surface acoustic wave device is referred to as an electrode occupancy,
the filter circuit includes two or more resonators that have resonance frequencies different from one another and includes a resonator having an electrode occupancy smaller than an electrode occupancy of another resonator having a different resonance frequency.

18. An electronic component comprising
a plurality of combinations of the filter circuits according to claim 14, wherein
the electronic component functions as a multiple filter or a multiplexer.

* * * * *